US006759735B2

(12) United States Patent
Omura et al.

(10) Patent No.: US 6,759,735 B2
(45) Date of Patent: Jul. 6, 2004

(54) HIGH POWER SEMICONDUCTOR DEVICE HAVING SEMICONDUCTOR CHIPS

(75) Inventors: Ichiro Omura, Yokohama (JP); Tomokazu Domon, Yokosuka (JP); Eitaro Miyake, Hino (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 73 days.

(21) Appl. No.: 10/347,927

(22) Filed: Jan. 22, 2003

(65) Prior Publication Data

US 2003/0137037 A1 Jul. 24, 2003

(30) Foreign Application Priority Data

Jan. 22, 2002 (JP) ...................................... 2002-012369

(51) Int. Cl.[7] .............................................. H01L 23/02
(52) U.S. Cl. ...................................... 257/678; 257/181
(58) Field of Search ................................. 257/181, 678, 257/688, 689, 182

(56) References Cited

U.S. PATENT DOCUMENTS

| 5,043,795 A | * | 8/1991 | Takahashi et al. ............ 357/79 |
| 5,278,434 A | * | 1/1994 | Niwayama ................... 257/181 |
| 6,303,974 B1 | | 10/2001 | Irons et al. |
| 2002/0154482 A1 | | 10/2002 | Miyake et al. |

OTHER PUBLICATIONS

T. Fujii, et al., ISPSO, pp. 33–36, "4.5kV –2000A Power Pack IGBT (Ultra High Power Flat–Packaged PT Type RC–IGBT)", May 22–25, 2000.
H. Matsuda, et al., IEEE, pp. 17–24, "Pressure Contact Assembly Technology of High Power Devices", 1997.
T. Koga, et al., Proceedings of 1998 International Symposium on Power Semiconductor Device & ICs, Kyoto, pp. 437–440, "Ruggedness and Reliability of the 2.5kV–1.8kA Power Pack IGBT With a Novel Multi–Collector Structure", 1998.

* cited by examiner

Primary Examiner—Roy Potter
(74) Attorney, Agent, or Firm—Oblon, Spivak, McClelland, Maier & Neustadt, P.C.

(57) ABSTRACT

A plurality of semiconductor chips is each arranged over a first conductor. Each of semiconductor chips has a first main electrode, a second main electrode and a control electrode. A second conductor is electrically connected to the second main electrode and has columns each having an upper surface arranged over each of the semiconductor chips and equal to the number of the semiconductor chips. A circuit board has openings penetrated by the columns and equal to the number of the semiconductor chips and has a first insulating film, a third conductive film arranged on a back surface of the first insulating film and electrically connected to the second conductor, and a fourth conductive film arranged on a surface of the first insulating film and electrically connected to the control electrode.

22 Claims, 28 Drawing Sheets

HIGH POWER SEMICONDUCTOR DEVICE HAVING SEMICONDUCTOR CHIPS

CROSS REFERENCE TO RELATED APPLICATIONS

This application is based upon and claims the benefit of priority from the prior Japanese Patent Applications No. P2002-012369 filed on Jan. 22, 2002; the entire contents of which are incorporated herein by reference.

BACKGROUND

The present invention relates to a power control semiconductor device. In particular, the present invention relates to a package structure for a compression bonding semiconductor chip.

In general, power control semiconductor devices include an Insulated Gate Bipolar Transistor (IGBT) and an Injection Enhanced Gate Transistor (IEGT). The IGBT and IEGT have MOS structures. High-power switching control for the IGBT and IEGT can be performed by control terminals (to be referred to as "gate terminals" hereinafter).

These power semiconductor devices can block a voltage higher than that of a conventional MOSFET or a bipolar transistor. The maximum operating voltage reaches a level of 6 kV. Like the MOSFET, the power semiconductor device has an advantage of voltage driving by a gate terminal. In addition, the power semiconductor device is characterized by a small conducting loss. According to these characteristics, the power semiconductor devices are popularly used.

A conventional power semiconductor device has an emitter copper post, an emitter buffer plate, power control semiconductor chips (to be referred to as "semiconductor chips" hereinafter) such as an IGBT and an IEGT, a collector buffer plate, and a collector copper post. The emitter buffer plate is arranged on the emitter copper post. The semiconductor chip is arranged on the emitter buffer plate. A collector buffer plate is arranged on the semiconductor chip. The collector copper post is arranged on the collector buffer plate. When a force is applied to the emitter copper post and the collector copper post to compress the emitter copper post and the collector copper post to each other, the emitter copper post, the emitter buffer plate, and the semiconductor chip are compression-bonded to each other. The semiconductor chip, the collector buffer plate, and the collector copper post are also compression bonded to each other. The emitter copper post, the emitter buffer plate, and the semiconductor chip are electrically and thermally connected to each other. The semiconductor chip, the collector buffer plate, and the collector copper post are electrically and thermally connected to each other.

However, an increase in compression bonding force per semiconductor chip may decrease the turn-off current handling capability of the power control semiconductor device. The power control semiconductor device includes semiconductor chips. The semiconductor chips are electrically connected to each other in parallel. Desirably, all the semiconductor chips operate evenly at turn-off. However, there are time delays and instabilities. The semiconductor chips do not necessarily operate evenly. The earlier power control semiconductor device had a turn-off current handling capability that is only half of the product of a number of the semiconductor chips and a turn-off current capability of one of the semiconductor chips.

SUMMARY

A semiconductor device according to embodiments of the present invention includes a first conductor having a plane surface, semiconductor chips each having a first surface arranged adjacent the plane surface, and having a first main electrode arranged on the first surface and electrically connected to the first conductor, a second main electrode arranged on a back surface of the first surface, and a control electrode arranged on the back surface of the first surface and configured to switch a current flowing between the first main electrode and the second main electrode, a second conductor electrically connected to the second main electrode and having columns each having an upper surface arranged below each of the semiconductor chips and equal to the number of the semiconductor chips, and a circuit board having openings penetrated by the columns, the number of the openings being equal to the number of the semiconductor chips and having a first insulating film, a first conductive film arranged on a peripheral portion of the first insulating film on a second surface of the first insulating film and electrically connected to one of the control electrode and the second conductor, and a second conductive film arranged on a back surface of the second surface of the first insulating film and the peripheral portion above the first conductive film and electrically connected to the other of the control electrode and the second conductor.

A semiconductor device according to embodiments of the present invention includes a first conductor having a plane surface, a first conductive plate arranged on the plane surface and electrically connected to the first conductor, semiconductor chips each having a first surface arranged on the first conductive plate, and having a first main electrode arranged on the first surface and electrically connected to the first conductor, a second main electrode arranged on a back surface of the first surface, and a control electrode arranged on the back surface of the first surface and configured to switch a current flowing between the first main electrode and the second main electrode, second conductive plates equal to the number of the semiconductor chips arranged on the back surface of the first surface electrically connected to the second main electrode, a pressure applied by a peripheral portion to one of the semiconductor chips configured to be a maximum of twice a mean pressure applied by one of the second conductive plates to the one of the semiconductor chips, and a second conductor electrically connected to the second main electrode and having columns equal to the number of the semiconductor chips and having upper surfaces arranged on the second conductive plate.

BRIEF DESCRIPTION OF THE DRAWINGS

FIG. 28 is a graph showing the profile of the surface of the emitter buffer plate with respect to the distance from the center of the emitter buffer plate.

DETAILED DESCRIPTION OF EMBODIMENTS

Figure 1:
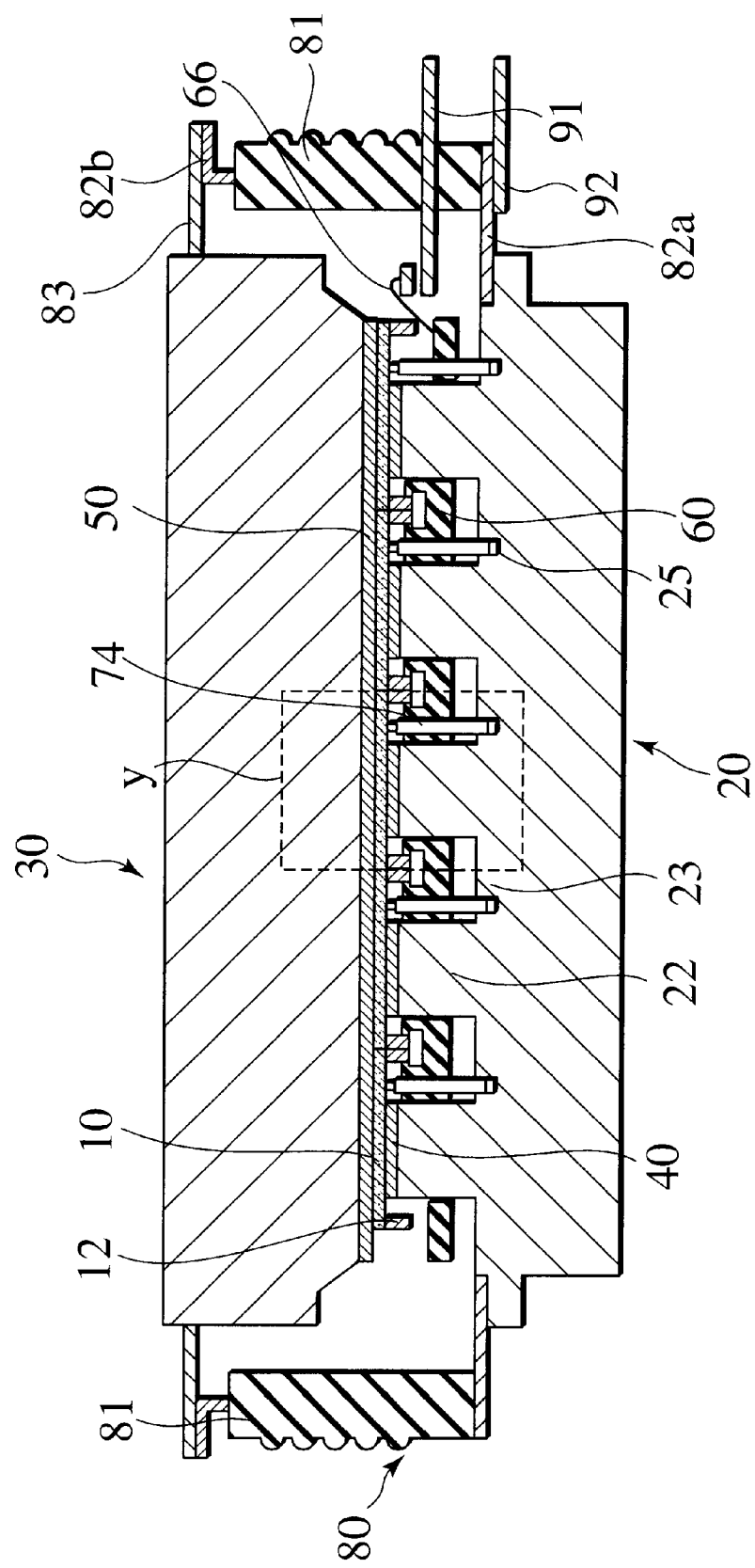
FIG. 1 is a sectional view of a power control semiconductor device according to Comparative Example 1.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

COMPARATIVE EXAMPLE 1

In the course of manufacturing a power control semiconductor device according to Comparative Example 1, the present inventors clarified the reason why an increase in compression bonding force per semiconductor chip decreases the turn-off current handling capability of the power control semiconductor device. The present inventors clarified reasons why the semiconductor chips do not necessarily operate evenly at a turn-off.

As shown in FIG. 1, the power control semiconductor device of Comparative Example 1 has an emitter copper post 20, a plurality of emitter buffer plates 40, a plurality of semiconductor chips 10 such as an IGBT and an IEGT, a collector buffer plate 50, and a collector copper post 30. The emitter copper post 20 and the collector copper post 30 have disk-like shapes having plane surfaces. The emitter buffer plates 40 are arranged on the emitter copper post 20. The number of emitter buffer plates 40 is equal to the number of semiconductor chips 10. The semiconductor chips 10 are arranged on the emitter buffer plates 40, respectively. The collector buffer plate 50 is arranged on the semiconductor chips 10. The collector copper post 30 is arranged on the collector buffer plate 50. When a force is applied to the emitter copper post 20 and the collector copper post 30 to compress the respective post, to each other, the emitter copper post 20, the emitter buffer plates 40, and the semiconductor chips 10 are compressed with respect to each other. The semiconductor chips 10, the collector buffer plate 50, and the collector copper post 30 are compression-bonded to each other. The emitter copper post 20, the emitter buffer plates 40, and the semiconductor chips 10 are electrically and thermally connected to each other. The semiconductor chips 10, the collector buffer plate 50, and the collector copper post 30 are electrically and thermally connected to each other.

A flange 82a is attached to the emitter copper post 20. A tubular ceramic member 81 is attached to the flange 82a. The tubular ceramic member 81 supports the flange 82b. On the other hand, the flange 83 is attached to the collector copper post 30. The flange 82b and the flange 83 are welded to each other. The emitter copper post 20, the collector copper post 30, the tubular ceramic member 81, the flanges 82a, 82b, and 83 constitute a package 80.

A gate terminal 91 penetrates the side wall of the tubular ceramics member 81. A control emitter terminal 92 is connected to the flange 82a by welding.

The emitter copper post 20 has a plurality of columns 22 and recessed portions 23 formed between the columns 22. The number of columns 22 is equal to the number of semiconductor chips 10. A chip guide plate 60 is arranged in the recessed portion 23. A chip frame 12 is arranged around the semiconductor chip 10. The chip guide plate 60 and the chip frame 12 fix the arrangement position of the semiconductor chip 10.

A gate connection portion 74 is arranged in the recessed portion 23. The gate connection portion 74 is electrically connected to the gate electrode of the semiconductor chips 10 and a lead line 66 connected to the gate terminal 91. The gate connection portion 74 is positioned in a hole 25 of the recessed portion 23 to penetrate the chip guide plate 60.

Figure 2:
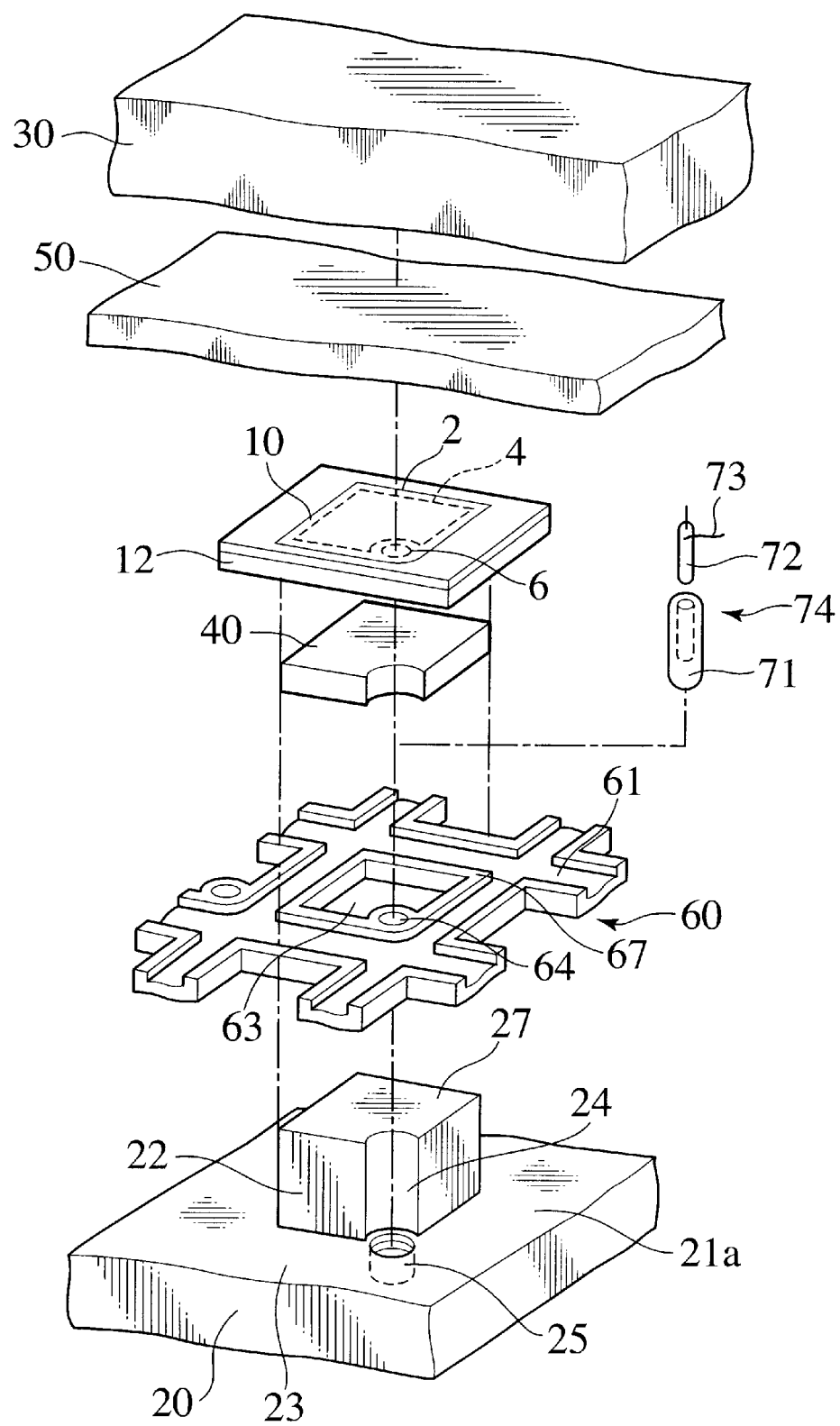
FIG. 2 is an exploded perspective view of the power control semiconductor device according to Comparative Example 1 in an area Y in FIG. 1.

As shown in FIG. 2, the column 22 of the emitter copper post 20 has an upper surface 27. The upper surface 27 is a plane surface. The upper surface 27 is compression-bonded to the emitter buffer plate 40. The upper surface 27 opposes the collector copper post 30. The recessed portion 23 has a bottom surface 21a. The side surfaces of the columns 22 perpendicularly stand on the bottom surface 21a. The plurality of columns 22 are arranged in the form of a grating.

A recessed side surface 24 is formed on the side surface of the column 22 near the hole 25.

The chip guide plate 60 has a planar insulating substrate 61, a sleeve 64, and a guide 67. The insulating substrate 61 has an opening 63 through which the column 22 passes. The sleeve 64 is arranged to be closed to the recessed side surface 24 above the hole 25. The guide 67 is arranged at the edge of the opening 63.

The gate connection portion 74 has a pin sheath 71 and a gate pin 72. The pin sheath 71 comprises of an insulator such as a ULTEM resin or a ceramic. The pin sheath 71 is a tube having a bottom portion. The gate pin 72 is inserted into the pin sheath 71 to have an exposed upper end. The gate pin 72 consists of a conductor. A gate lead line 73 is electrically connected to the side wall of the upper end of the gate pin 72. The gate connection portion 74 penetrates the sleeve 64, and is inserted into the hole 25. In this manner, the gate connection portion 74 is fixed.

The semiconductor chip 10 has a collector electrode 2, an emitter electrode 4, and a gate electrode 6. The collector electrode 2 is arranged on the upper surface of the semiconductor chip 10 and is compression-bonded to the collector buffer plate 50. The emitter electrode 4 is arranged on the lower surface of the semiconductor chip 10 and is compression-bonded to the emitter buffer plate 40. The gate electrode 6 is arranged on the lower surface of the semiconductor chip 10 and is in electrical contact with the gate pin 72. The gate electrode 6 is arranged immediately above the gate pin 72. The gate electrode 6 can switch a current flowing between the collector electrode 2 and the emitter electrode 4. The chip frame 12 is arranged between guides 76. In this manner, the semiconductor chip 10 is fixed. The semiconductor chip 10 has a plurality of elements such as IGBTs which are connected in parallel or IEGTs. The lower surface of the semiconductor chip 10 is slightly larger than the upper surface of the emitter buffer plate 40 and the upper surface of the column 22.

The surface shape of the emitter buffer plate 40 is the same shape as that of the upper surface 27 of the column 22. The surface shape has a size equal to that of the upper surface 27. The collector copper post 30 has a disk-like shape having a diameter equal to that of the emitter copper post 20. The entire surface opposing the emitter copper post 20 is formed to have an approximately planar surface. The collector buffer plate 50 is formed to have the same size and shape as that of the opposite surface of the collector copper post 30.

Figure 3:
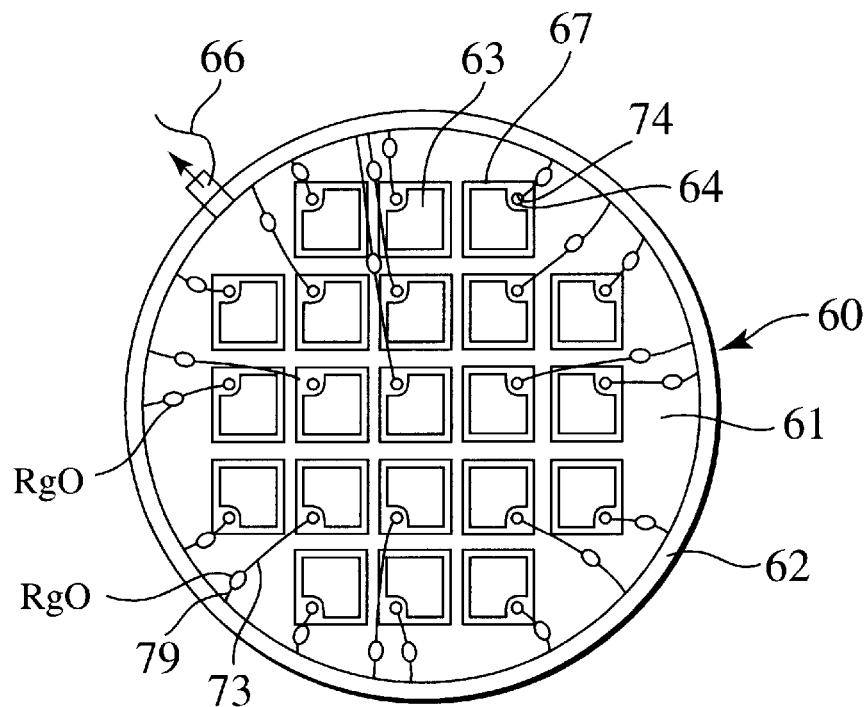
FIG. 3 is an upper view of a chip guide plate of the power control semiconductor device according to Comparative Example 1.
Figure 4:
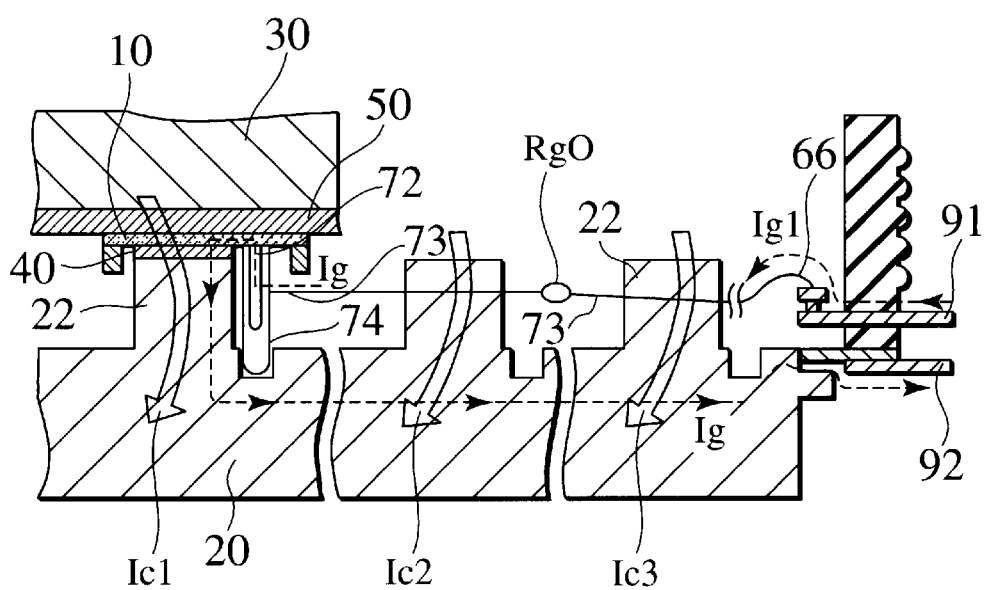
FIG. 4 is a pattern diagram of the power control semiconductor device according to Comparative Example 1 showing a route of a gate current.

As shown in FIG. 3, the chip guide plate 60 has an insulating substrate 61, a gate ring 62, lead lines 73 and 79, and a gate resistor Rg0. The insulating substrate 61 is a planar disk. A plurality of openings 63 are formed in the insulating substrate 61 in the form of a grating. The gate ring 62 is arranged on the upper surface of the peripheral edge of the insulating substrate 61. The gate ring 62 is electrically connected to the lead line 66. The lead line 79 is electrically connected to the gate ring 62. One end of the gate resistor Rg0 is electrically connected to the lead line 79. The lead line 73 is electrically connected to the other end of the gate resistor Rg0 and the lead line 73.

In operation of the power control semiconductor device of Comparative Example 1, a gate current Ig1 flows into the gate terminal 91 and flows out of the control emitter terminal 92. The gate current Ig1 is generated by a gate drive circuit. The gate drive circuit is connected between the gate terminal 91 and the control emitter terminal 92. The gate current Ig1 sequentially flows in the gate terminal 91, the lead line 66, the gate ring 62, the lead line 79, the gate resistor Rg0, the lead line 73, the gate pin 72, the gate electrode 6, the semiconductor chips 10, the emitter electrode 4, the emitter buffer plates 40, the columns 22, the emitter copper post 20, and the control emitter terminal 92. The flow of the gate current Ig1 raises the potential of the gate electrode 6. A main current Ic1 sequentially flows in the collector copper post 30, the collector buffer plate 50, the collector electrode 2, the semiconductor chips 10, the emitter electrode 4, the emitter buffer plates 40, the columns 22, and the emitter copper post 20. At this time, in each of the plurality of semiconductor chips 10, a gate current Ig and main currents Ic1 to Ic3 flow. A sum of values of the main currents Ic1 to Ic3 may be 1 kA or more.

The gate current Ig traverses the emitter copper post 20 in which main currents Ic2 and Ic3 flow. For this reason, the gate current Ig is easily affected by a change in main current vectors of the main currents Ic1 to Ic3 in the emitter copper post 20. More specifically, when the main currents Ic1 to Ic3 are extracted from a part of the bottom surface of the emitter copper post 20 via a copper sheet to an exterior of the power control semiconductor device, the symmetry between the main current vectors deteriorates. The flowing direction of main currents Ic1 to Ic3 at the copper sheet and the direction of compression of the respective semiconductor chips 10 intersect at right angles. Because of this, the main current vector lacks symmetry. This asymmetry makes the affects to the gate currents Ig in the respective semiconductor chips 10 different.

The imbalance between the gate currents Ig of the plurality of semiconductor chips 10 changes a main current vector in the emitter copper post 20 in a switching operation of the main currents Ic1 to Ic3. This change differently affects the gate currents Ig of the respective semiconductor chips 10. The change also affects the gate voltages of the respective semiconductor chips 10.

Figure 5:
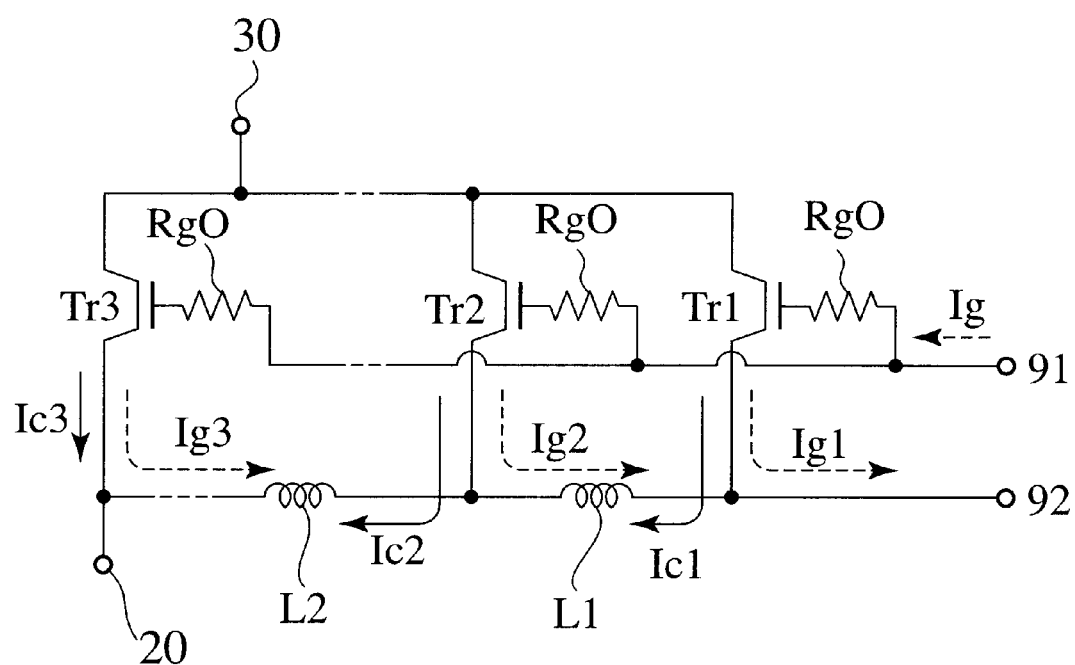
FIG. 5 is a circuit diagram of the power control semiconductor device according to Comparative Example 1.

In the power control semiconductor device of Comparative Example 1, as shown in FIG. 5, transistors Tr1 to Tr3 are connected in parallel between the collector copper post 30 and the emitter copper post 20. It is considered that parasitic inductances L1 and L2 exist in the emitter copper post 20. The main current vector changes at a turn-off. The change in the main current vector increases a current change ratio di/dt of the main currents Ic1 to Ic3. The main currents Ic1 to Ic3 are large currents. Large electromotive forces occur in parasitic inductances L1 to L3. The uniformity of the emitter potentials of transistors Tr1 to Tr3 is disrupted or destroyed by the electromotive forces. Specifically, the emitter potential of the transistor Tr2 increases more than the emitter potential of the transistor Tr1. The emitter potential of the transistor Tr3 increases more than the emitter potential of the transistor Tr2. The potential differences between gates and emitters become smallest in the transistor Tr3. The potential difference between the gate and the emitter of the transistor Tr2 decreases more than the potential difference between the gate and the emitter of the transistor Tr1. The transistor Tr3 becomes off first. Next, the transistor Tr2 turns off. The main current focuses on the transistor Tr1 temporarily and the transistor Tr1 breaks down.

It is considered that the changes of the gate currents Ig1 to Ig3 vibrate the gate currents Ig1 to Ig3. The vibrations of the gate currents Ig1 to Ig3 vibrate the main currents Ic1 to Ic3. The vibrations are produced by electromotive forces generated by the parasitic inductances L1 and L2.

As a countermeasure against this, the gate currents Ig1 to Ig3 should be prevented from flowing into the parasitic inductances L1 to L3.

Embodiment 1

Figure 6:
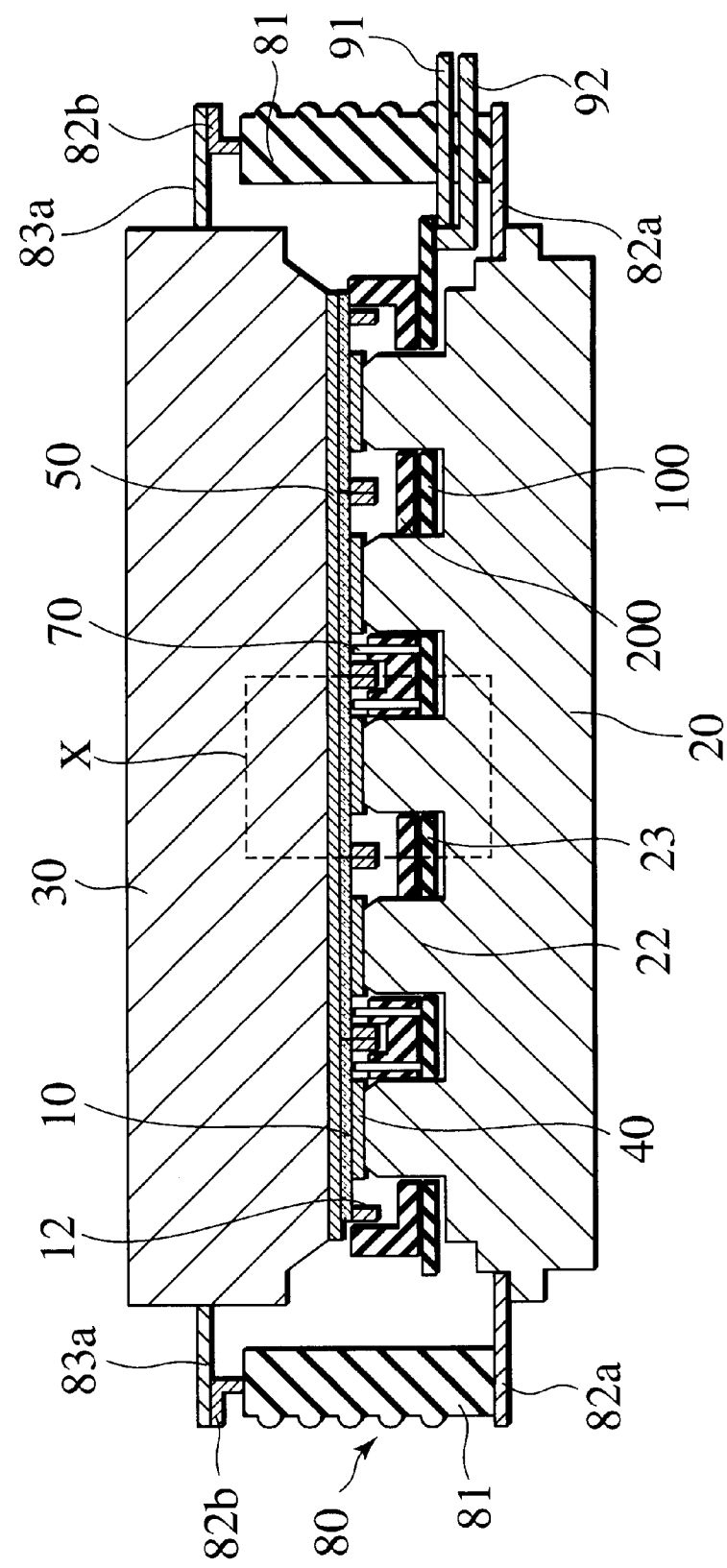
FIG. 6 is a sectional view of a power control semiconductor device according to Embodiment 1 of the present invention.
Figure 7:
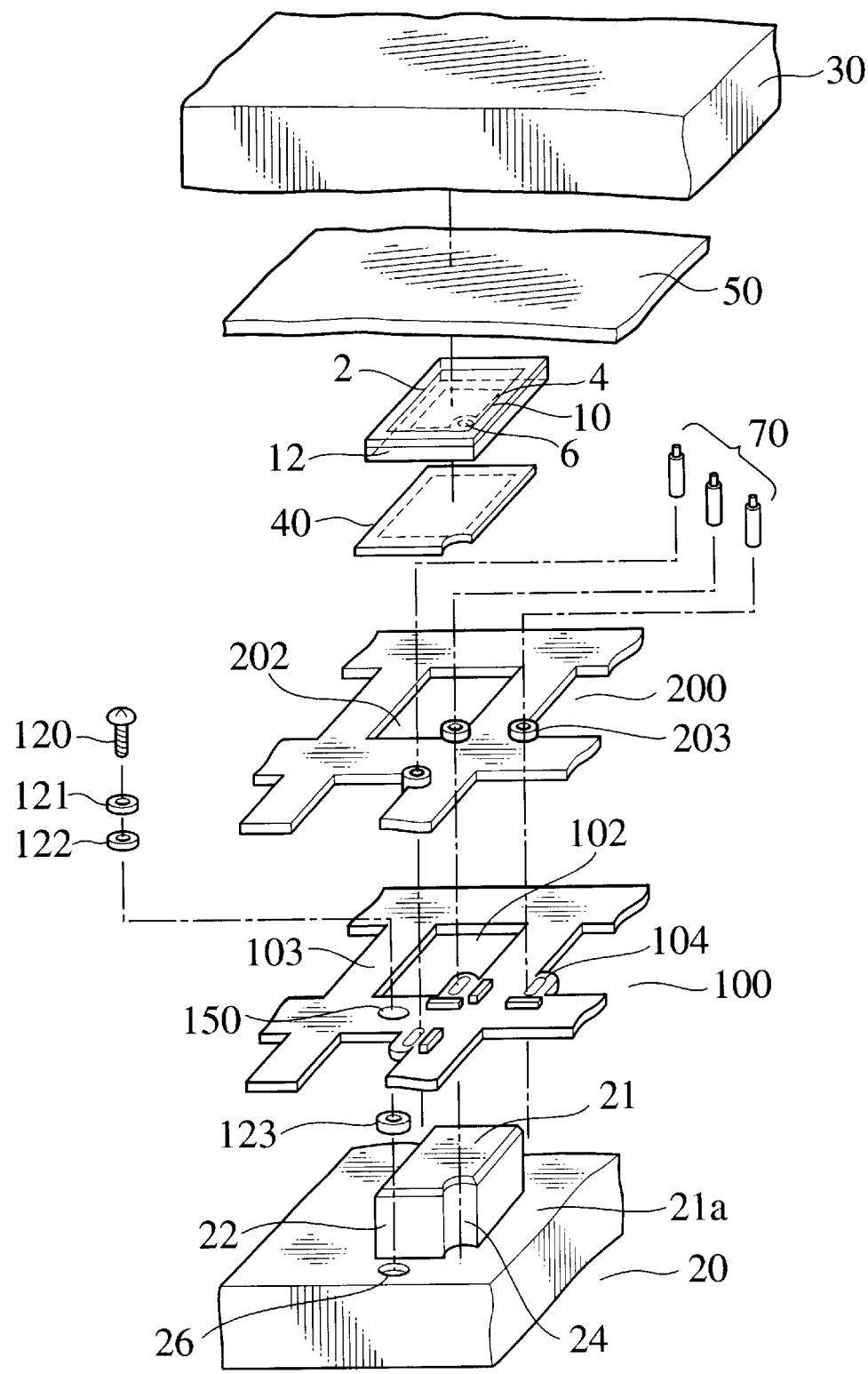
FIG. 7 is an exploded perspective view of the power control semiconductor device according to Embodiment 1 in an area X in FIG. 6.

A power control semiconductor device according to Embodiment 1 of the present invention includes, as shown in FIGS. 6 and 7, a collector copper post 30 serving as a conductor, a plurality of semiconductor chips 10, an emitter copper post 20 serving as a conductor, a chip guide plate 200, an emitter buffer plates 40 serving as a conductor, a collector buffer plate 50 serving as a conductor, and a circuit board 100. The upper and lower surfaces of the collector copper post 30 are plane surfaces. The collector copper post 30 is made of copper (Cu).

The semiconductor chips 10 are formed such that the upper surfaces of the semiconductor chips 10 are arranged under or below the lower surface of the collector copper post 30. Each of the semiconductor chips 10 has a collector electrode 2 serving as a main electrode, an emitter electrode 4 serving as a main electrode, and a gate electrode 6 serving as a control electrode. The semiconductor chip 10 merges a semiconductor device such as an IGBT or an IEGT.

The collector electrode 2 is arranged on the surface of the semiconductor chips 10. The collector electrode 2 is electrically connected to the collector copper post 30. The emitter electrode 4 is arranged on the back surface of the semiconductor chip 10. The gate electrode 6 is arranged on the back surface of the semiconductor chip 10. The gate electrode 6 can switch main currents Ic1 to Ic3 flowing between the collector electrode 2 and the emitter electrode 4.

The semiconductor chip 10 has a chip frame 12 which is formed at the peripheral edge of the semiconductor chip 10 and which is constituted by a circular insulating member. The semiconductor chip 10 is positioned by the chip frame 12 and the chip guide plate 200. Furthermore, the chip frame 12 prevents leakage discharge from a corner of the cross section of the back surface of the semiconductor chip 10 to the circuit board 100.

The emitter copper post 20 is electrically connected to the emitter electrode 4. The emitter copper post 20 has columns 22 the number of which is equal to the number of semiconductor chips 10. The upper surface of the column 22 is arranged under or below the semiconductor chip 10. The emitter copper post 20 including the column 22 made of copper. The emitter copper post 20 is arranged opposite the collector copper post 30. High-pressure compression between the emitter copper post 20 and the collector copper post 30 compression-bonds and electrically and thermally connects the semiconductor chip 10, the emitter copper post 20, and the collector copper post 30 to each other.

In addition, each of the columns 22 is cut at, e.g., one corner. An inverted-L recessed portion 24 is formed in the column 22. This recessed portion 24 corresponds to the position of the gate electrode 6 of the semiconductor chip 10. For example, when the gate electrode 6 is located at the center of the sides of the back surface of the semiconductor chip 10, the recessed portion 24 is formed at the center of the sides of the upper surface 21 of the column 22. A screw hole 26 is formed in a bottom surface 21a near the root on base of the columns 22.

A tubular ceramic member 81 is arranged on the emitter copper post 20 through a flange 82a. A flange 82b is attached to the tubular ceramic member 81. On the other hand, a flange 83a is attached to the collector copper post 30. The flange 82b and the flange 83a are welded to each other. The emitter copper post 20, the collector copper post 30, the tubular ceramic member 81, the flanges 82a, 82b, and 83a constitute a package 80.

A gate terminal 91 to which a gate signal is applied and a control emitter terminal 92 to which an emitter potential for gate drive are arranged on the side wall of the tubular ceramic member 81 such that the gate terminal 91 and the control emitter terminal 92 penetrate the tubular ceramic member 81. In this case, the control emitter terminal 92 is arranged in parallel to the gate terminal 91.

The circuit board 100 on which a gate signal wiring pattern and an emitter wiring pattern are formed through an insulating layer is arranged in the recessed portion 23 of the emitter copper post 20. The gate signal wiring pattern is electrically connected to the gate terminal 91, and the emitter wiring pattern is electrically connected to the emitter copper post 20 on the bottom surface near the root on base of the column 22 and electrically connected to the emitter terminal 92.

A chip guide plate 200 for positioning the semiconductor chip 10 is arranged in the recessed portion 23 of the emitter copper post 20 such that the chip guide plate 200 is stacked on the circuit board 100.

A first connection conductor (to be referred to as "a gate connection conductor" hereinafter) 70 is arranged in the recessed portion 23 of the emitter copper post 20 such that the first connection conductor 70 penetrates the chip guide plate 200. The first connection conductor 70 electrically connects the semiconductor chips 10 and the gate signal wiring pattern of the circuit board 100 to each other.

Figure 8:
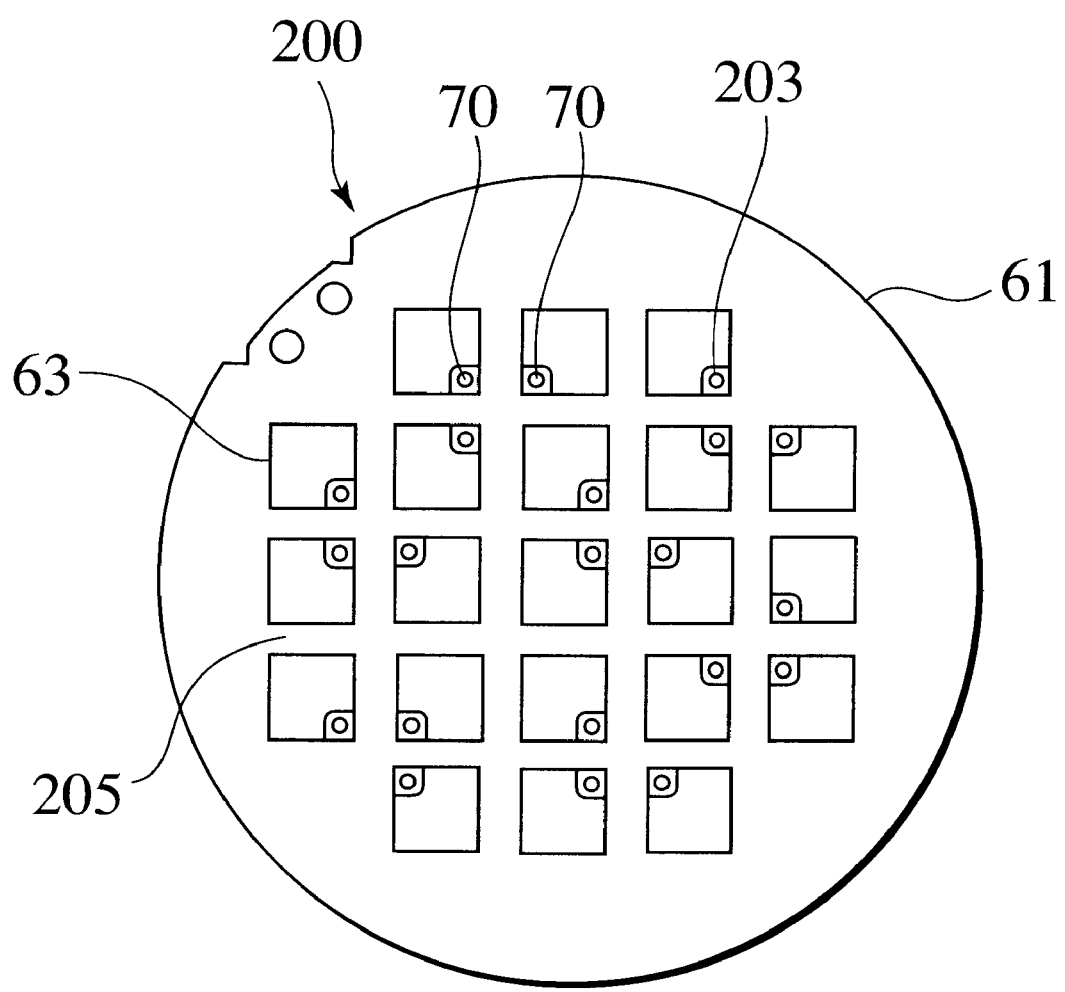
FIG. 8 is an upper view of a chip guide plate of the power control semiconductor device according to Embodiment 1.

As shown in FIGS. 7 and 8, the chip guide plate 200 has an insulating substrate 61 and a sleeve 203. The insulating substrate 61 is a planar disk. A plurality of openings 63 are formed in the insulating substrate 61 in the form of a grating. The number of openings 63 is equal to the number of semiconductor chips 10. A frame 205 is formed between the plurality of openings 63. The connection conductor 70 passes through the hole of the sleeve 203. The connection conductor 70 is electrically connected to the gate electrode 6. The number of connection conductors 70 and the number of sleeves 203 are equal to the number of semiconductor chips 10.

The chip guide plate 200 is formed to have a planar-disk-like shape. Openings in which the columns 22 of the emitter copper post 20 are fitted are formed in the same arrangement as that of the columns 22 to have almost the same cross-sectional shapes as those of the columns 22. In the opening 202, the sleeve 203 in which the connection conductor 70 is fitted is arranged on a portion opposing the recessed portion 24 of the column 22. The sleeve 203 is a pipe having a radial thickness of about 0.25 to 0.5 mm. The inner diameter of the pipe of the sleeve 203 is a diameter which is slightly larger than that of the connection conductor 70 such that the connection conductor 70 smoothly moves. An anti-drop stopper may be formed on the sleeve 203 to improve the packaging facility of the connection conductor 70.

The sleeve 203 and the chip frame 12 can fix the semiconductor chip 10 and the emitter buffer plates 40. A side wall 67 which covers the side surface of the column 22 in FIG. 2 is advantageously formed on the chip guide plate 200 to prevent leakage discharge from the corner of the collector potential portion (end or cut surface of the chip 10), especially, the corner of the cut surface on the emitter electrode side of the semiconductor chip 10 to the column 22 of the emitter copper post 20. Since a decrease in height of the column 22 does not cause leakage discharge due to the side wall 67, the column 22 can be decreased in height, and the heat-radiation effect is improved.

The collector buffer plate 50 and the emitter buffer plates 40 are made of molybdenum (Mo). The collector buffer plate 50 is arranged between the lower surface of the collector copper post 30 and the upper surface of the semiconductor chip 10, and is in direct contact with the collector copper post 30 and the semiconductor chip 10. The semiconductor chip 10 electrically connects the collector electrode 2 of the semiconductor chip 10 and the collector copper post 30 to each other.

The emitter buffer plates 40 is arranged between the back surface of the semiconductor chip 10 and an upper surface 21 of the column 22, and is in direct contact with the semiconductor chip 10 and the column 22. The emitter buffer plates 40 is electrically connected to the emitter electrode 4 of the semiconductor chip 10 and the emitter copper post 20. The shape of the upper surface 21 is a square.

As shown in FIGS. 9 to 13B, the circuit board 100 has an insulating substrate 101, conductive films 105, 107, 108, 110, 145, and 146 formed on a wiring pattern, insulating films 106 and 109, and through holes 140 and 141. The circuit board 100 has an opening 102, a projecting portion 104, and a frame 103. The columns 22 can pass through the openings 102, respectively. The number of openings 102 is equal to the number of semiconductor chips 10. The projecting portion 104 is arranged adjacent to the opening 102. The frame 103 is arranged between the plurality of openings 102. The circuit board 100 is arranged on the recessed portion 22 of the emitter copper post 20.

The insulating substrate 101 has the same disk-like structure as that of the emitter copper post 20. As the insulating substrate 101, a double-sided substrate obtained by applying a copper pattern to one or both sides of an insulating sheet or applying conductive sheets on both the sides of an insulating sheet is desirably used. In order to maintain the mechanical strength of the double-sided substrate, the thickness t2 of the insulating substrate 101 is set at 200 µm or more. Actually, two copper pattern layers 105 and 107 between which an insulating layer 106 is interposed are formed on one surface of the insulating substrate 101. The thicknesses t1 and t2 of the insulating films 106 and 109 are preferably set at 100 µm or less depending on the materials of the insulating films. As the circuit board 100, BT resist (tradename) or the like is preferably used rather than a conventional printed board (FR4) because the degree of insulativity of the BT resist or the like is higher than that of the printed board (FR4). In addition, when the circuit board 100 is constituted by a double-sided or multi-layered flexible board made of an imide-based resin, distortion caused by thermal expansion or a tolerance can be absorbed by the flexibility of the circuit board 100. For this reason, the reliability of the circuit board 100 is preferably improved. The thickness t2 of the insulating substrate 101 was set at about 200 µm.

The openings 102 having the same arrangement as that of the columns 22 are formed in the form of a grating in the insulating substrate 101. The columns 22s of the emitter copper post 20 pass through the openings 102, respectively. The opening 102 is formed to have an almost square shape having one corner which is cut in an almost inverted L-shape like the planar shape of the upper surface 21 of the column 22. The projecting portion 104 engaged with the recessed portion 24 of the column 22 is formed at the grating-shaped frame 103 surrounding the openings 102.

Figure 11A:
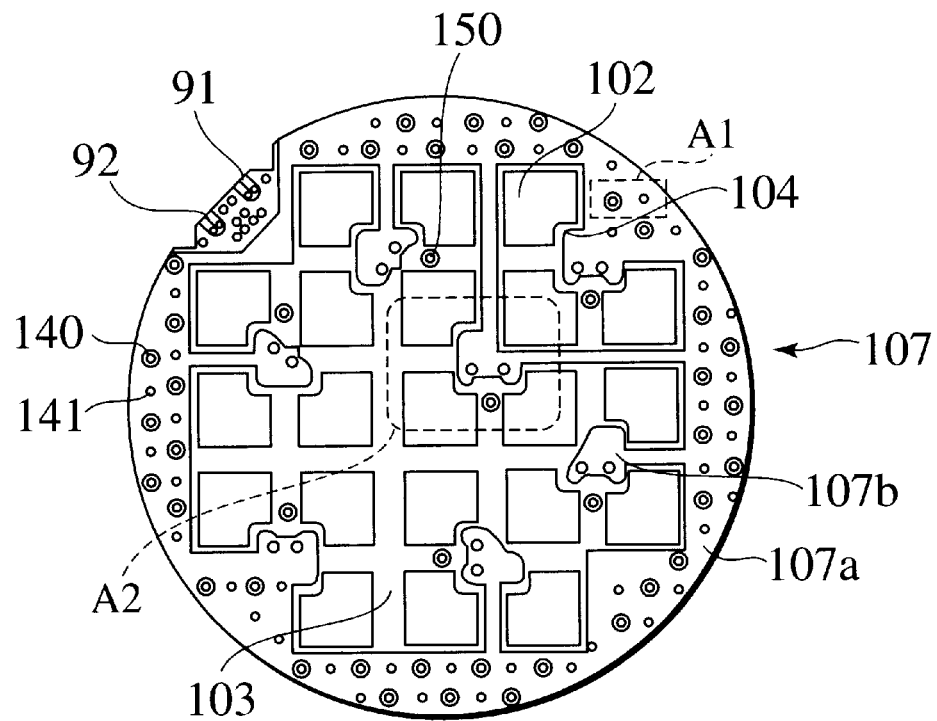
FIG. 11A is a sectional view along a II—II line in FIG. 10B.
Figure 11B:
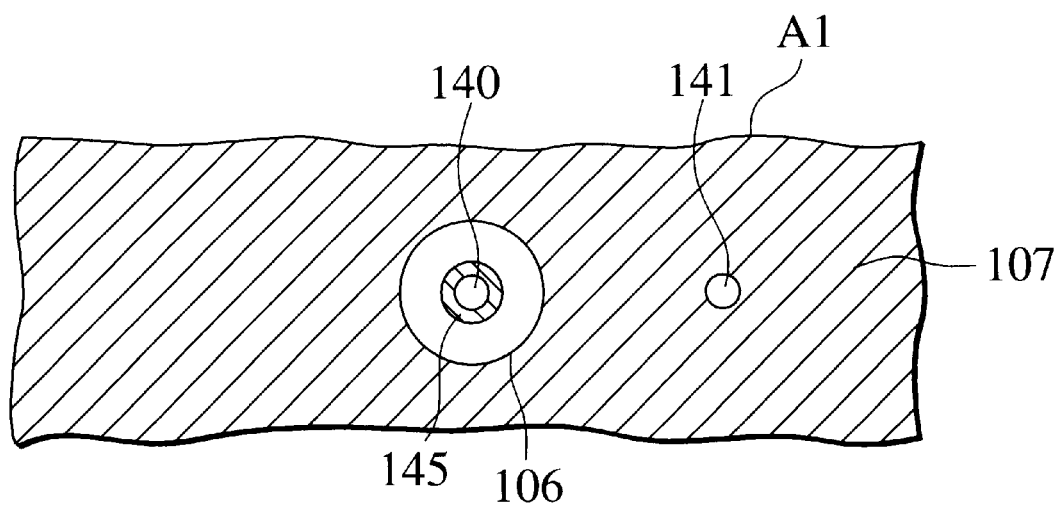
FIG. 11B is an enlarged view of an area A1 in FIG. 11A.

The conductive film 107 is arranged on the upper surface of the insulating substrate 101. The conductive film 107, as shown in FIG. 11A, has a ring 107a and a branch 107b. The ring 107a is arranged around the insulating substrate 101. The branch 107b is arranged on the frame 103. The conductive film 107 is electrically connected to the emitter copper post 20.

The insulating layer 106 is arranged on the conductive film 107. The thickness t1 of the insulating layer 106 is about 50 µm. The conductive film 107 is constituted by the ring 107a and the branch 107b. The ring 107a is formed on the peripheral edge of the insulating substrate 101 entirely surrounding the opening 102 such that the ring 107a is separated from the gate terminal 91 and the control emitter terminal 92. The branch 107b is formed on the frame 103 of the insulating substrate 101 to extend from the ring 107a to almost the projecting portion 104. The width of the branch 107b is about 3 to 4 mm. The conductive film 107 is formed in parallel to the conductive film 105 and superposed on the conductive film 105. The conductive film 107 extends to the lower position of a conductive film 130a.

Figure 9:
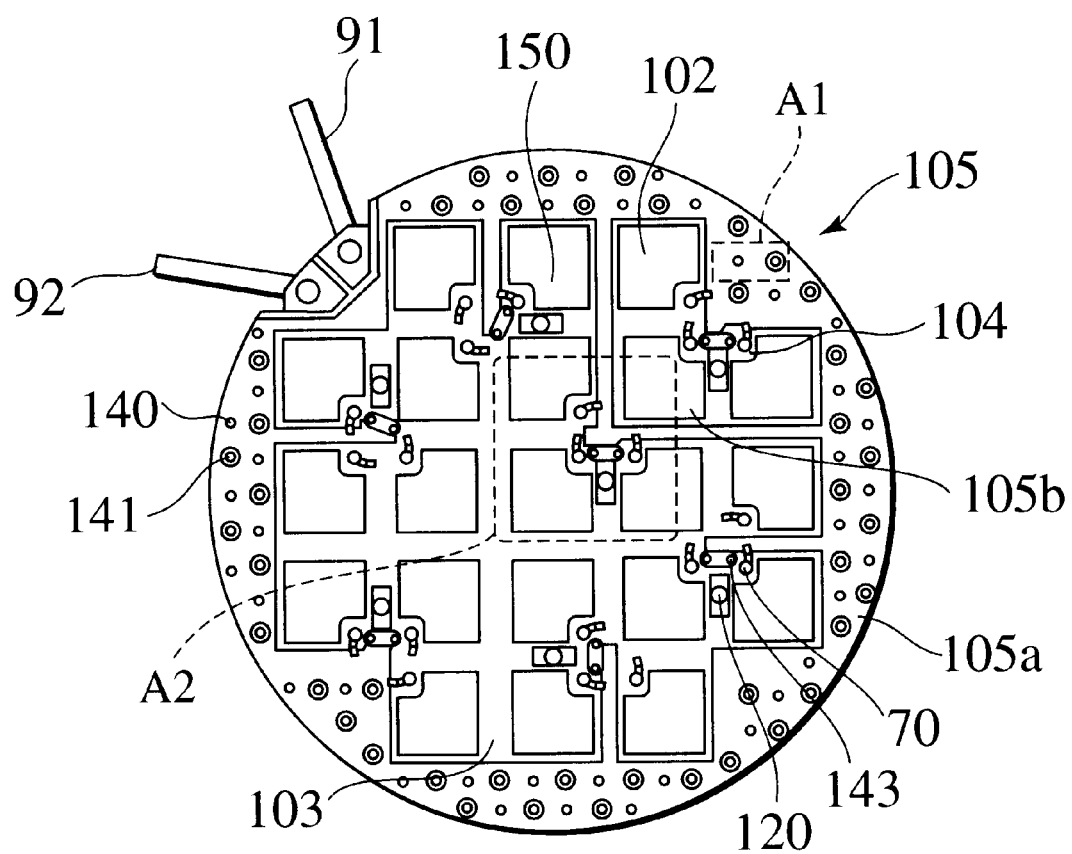
FIG. 9 is an upper view of a circuit wiring board of the power control semiconductor device according to Embodiment 1.

The conductive film 105 is arranged on the insulating layer 106 directly above the conductive film 107. The conductive film 105, as shown in FIG. 9, has a ring 105a and a branch 105b. The ring 105a is arranged around the insulating substrate 101. The ring 105a is formed on the peripheral portion entirely surrounding the openings 102 to pass over the gate terminal 91 and the control emitter terminal 92. The branch 105b is arranged on the frame 103. The branch 105b has a width of 3 to 4 mm. The branch 105b is formed to extend from the ring 105a to almost the openings 102. The conductive film 105 arranged around the insulating substrate 101 is electrically connected to the gate electrode 6 of the semiconductor chip 10. The conductive film 107 may be electrically connected to either of the gate electrode 6 of the semiconductor chip 10 and the emitter copper post 20. At this time the conductive film 105 is electrically connected to the other of the gate electrode 6 and the emitter copper post 20.

Namely, on the circuit board 100, two or more conductive layers, i.e., the conductive film 105 of the gate signal wiring pattern and the conductive film 107 of the emitter wiring pattern are laminated through the insulating layer 106. The conductive films 105 an 107 are alternately superposed and arranged in parallel to each other.

Figure 12A:
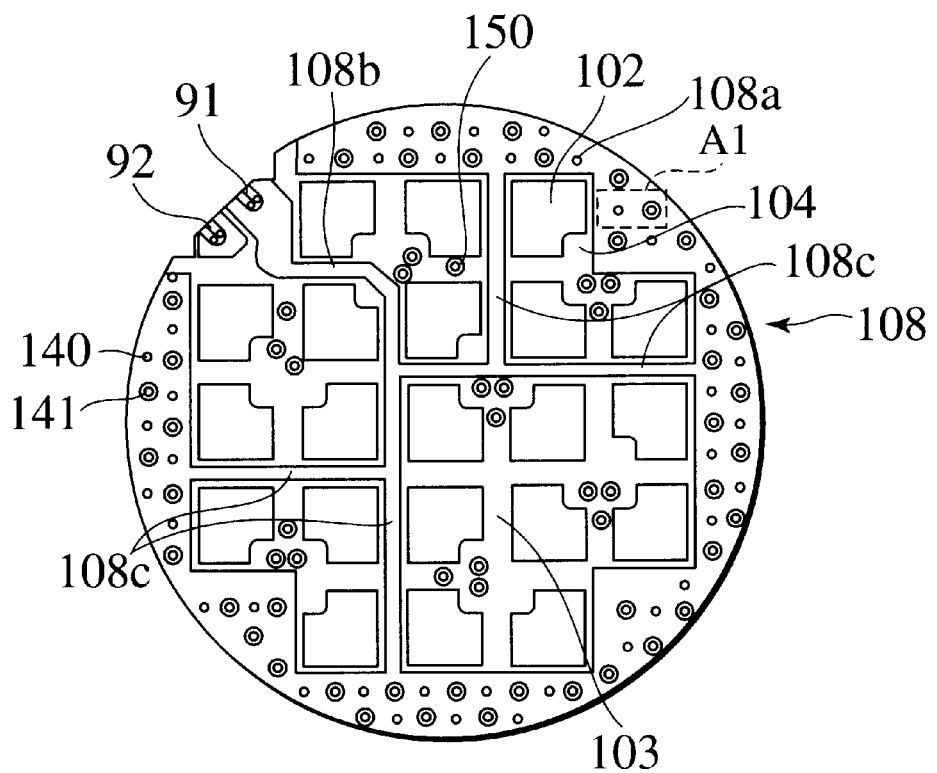
FIG. 12A is a sectional view along a III—III line in FIG. 10B.
Figure 12B:
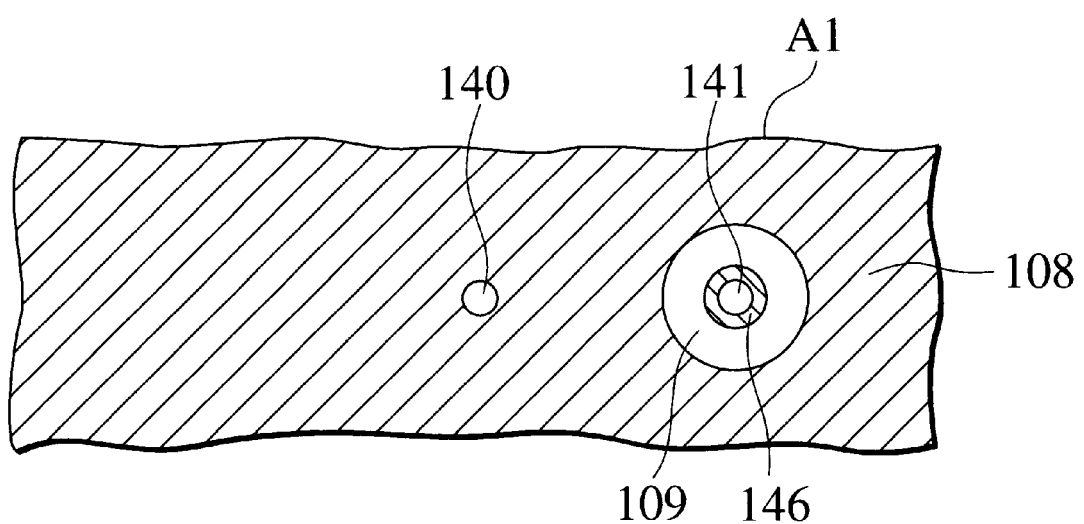
FIG. 12B is an enlarged view of an area A1 in FIG. 12A.

A conductive film 108 is arranged on the back surface of the insulating substrate 101. The conductive film 108 is electrically connected to the conductive film 105. The conductive film 108, as shown in FIG. 12A, has a trunk 108b, a branch 108c, and a ring 108a. The trunk 108b is arranged to extend from the peripheral portion of the insulating substrate 101 to the frame 103 of the center. The trunk 108b is electrically connected to the gate terminal 91. The branch 108c is arranged on the frame 103. The branch 108c is electrically connected to the trunk 108b. The ring 108a is arranged on the peripheral portion of the insulating substrate 101. The branch 108c is electrically connected to the trunk 108b. The ring 108a is arranged around the insulating substrate 101. The ring 108a is electrically connected to the branch 108c.

The insulating film 109 is arranged on the conductive film 108. The thickness t3 of the insulating film 109 is about 50 μm.

Figure 13A:
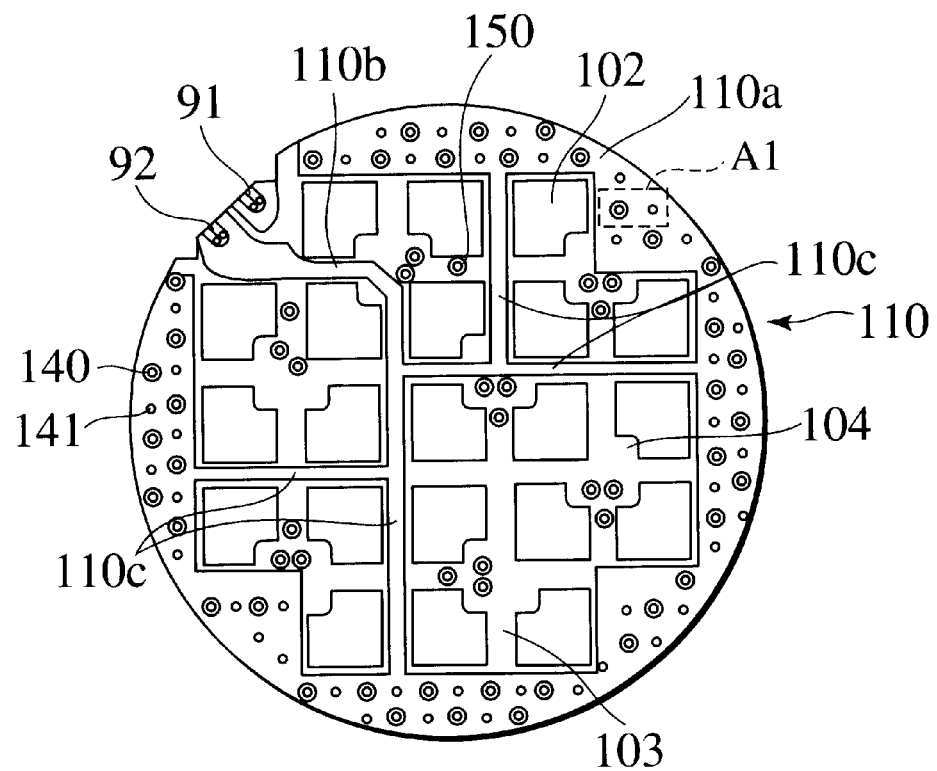
FIG. 13A is a sectional view along a IV—IV in FIG. 10B.
Figure 13B:
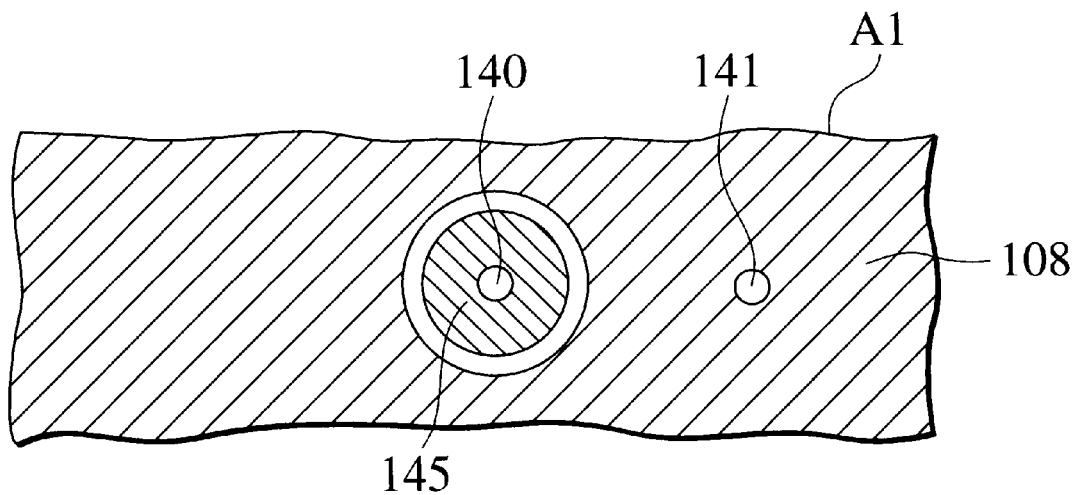
FIG. 13B is an enlarged view of an area A1 in FIG. 13A.

A conductive film 110 is arranged on the insulating film 109 and directly below the conductive film 108. The conductive film 110 is electrically connected to the conductive film 107. The conductive film 110, as shown in FIG. 13A, has a trunk 110b, a branch 110c, and a ring 110a. The trunk 110b is arranged to extend from the peripheral portion of the insulating substrate 101 to the frame 103 at the center. The trunk 110b is electrically connected to the control emitter terminal 92. The branch 110c is arranged on the frame 103. The branch 110c is electrically connected to the trunk 110b. The ring 110a is arranged around the insulating substrate 101. The ring 110a is electrically connected to the branch 110c.

More specifically, the gate electrode 6 of the semiconductor chip 10 and the gate terminal 91 are electrically connected to each other. The gate electrode 6 of the semiconductor chip 10 and the gate terminal 91 are electrically connected to either of the conductive film 105 and the conductive film 107 and either of the conductive films 108 and 110. At this time, the emitter copper post 20 and the control emitter terminal 92 are electrically connected to each other. The emitter copper post 20 and the control emitter terminal 92 are electrically connected to the other of the conductive films 105 and 107 and the other of the conductive films 108 and 110.

The circuit board 100 has a four-layer structure including the conductive film 105 serving as the first layer, the conductive film 107 serving as the second layer, the conductive film 108 serving as the third layer, and the conductive film 110 serving as the fourth layer.

The rings 108a and 110a are formed on the peripheral edge of the insulating substrate 101 entirely surrounding the openings 102. The rings 108a and 110a are not arranged on the gate terminal 91 and the control emitter terminal 92. The branches 108c and 110c are formed on the frame 103 of the insulating substrate 101 to extend from the rings 108a and 110a to almost the openings 102. The rings 108a and 110c have widths of about 3 to 4 mm. The trunk 108b is connected to the branch 108c while passing through a portion where the ring 108a is removed from the gate terminal 91. The trunk 110b is connected to the branch 110c through a portion where the ring 110a is removed from the control emitter terminal 92.

With the above configuration, gate signals can be supplied to all the semiconductor chips 10 at almost equal timing. Anywhere on the ring 108a of the conductive film 108, the timing at which the gate currents Ig are present are not different from each other. In this manner, even in a turn-on or turn-off operation, a current can be uniform between semiconductor chips 10. Since a large current does not instantaneously flow in the semiconductor chip 10, damage to the semiconductor chip 10 can be prevented.

A plurality of through holes 140 are arranged around the circuit board 100. The through holes 140 pass through the circuit board 100. Conductive films 145 are formed on the side walls of the through holes 140. The conductive film 145 are electrically connected to the conductive film 105 and the conductive film 108. The through holes 141 are arranged around the circuit board 100 and near the through holes 140. The through holes 141 penetrate the circuit board 100. The conductive films 146 are formed on the side walls of the through holes 141. The conductive films 146 are electrically connected to the conductive film 107 and the conductive film 110. The conductive films 145 and 146 can be formed by plating.

The conductive film 105 is arranged on the circuit board 100 on the semiconductor chip 10 side. The conductive film 107 is formed at a position on the emitter copper post 20 side with reference to an intermediate position between the back surface of the semiconductor chip 10 and the bottom surface 21a of the recessed portion 23 of the emitter copper post 20.

Figure 10A:
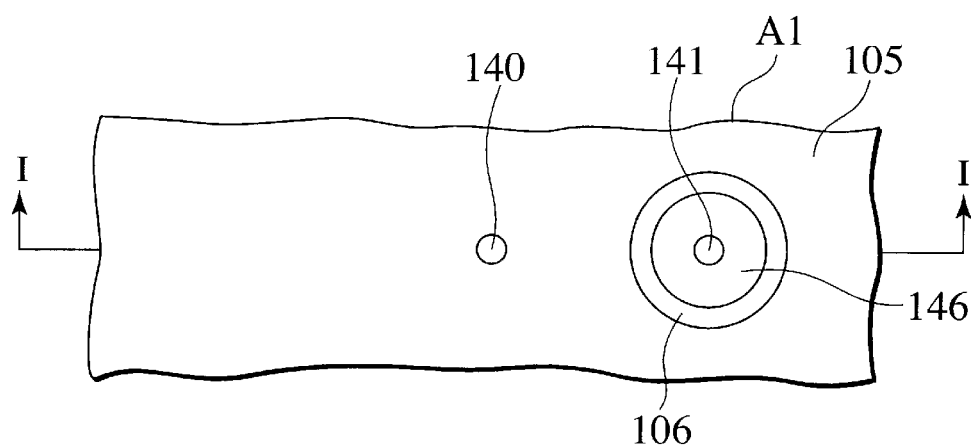
FIG. 10A is an enlarged view of an area A1 of the circuit wiring board of the power control semiconductor device according to Embodiment 1.
Figure 10B:
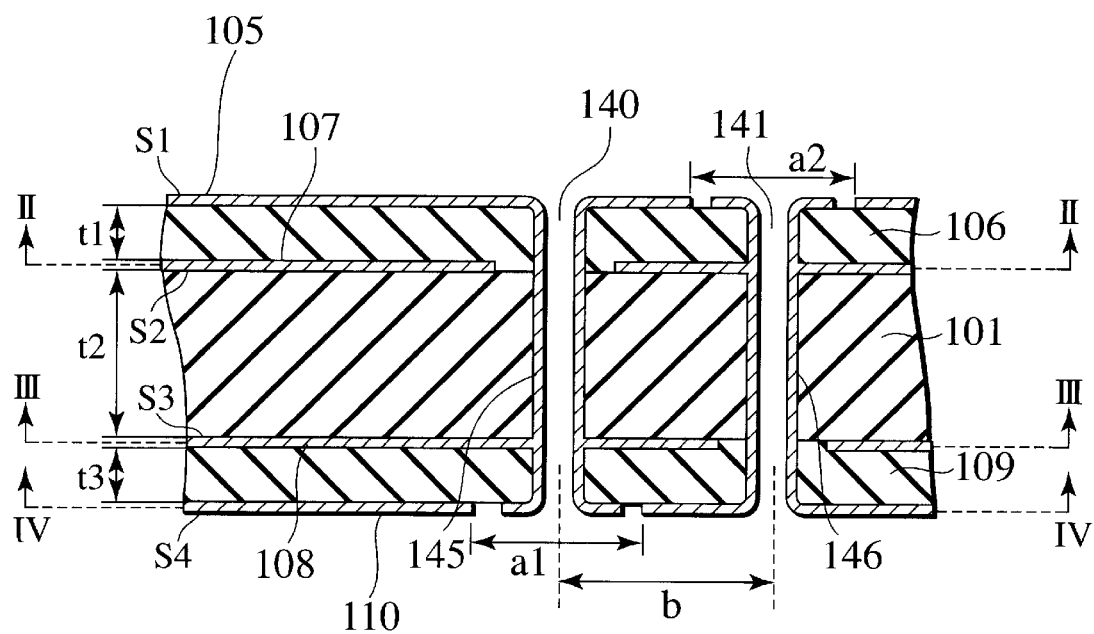
FIG. 10B is a sectional view along a I—I line in FIG. 10A.
Figure 14:
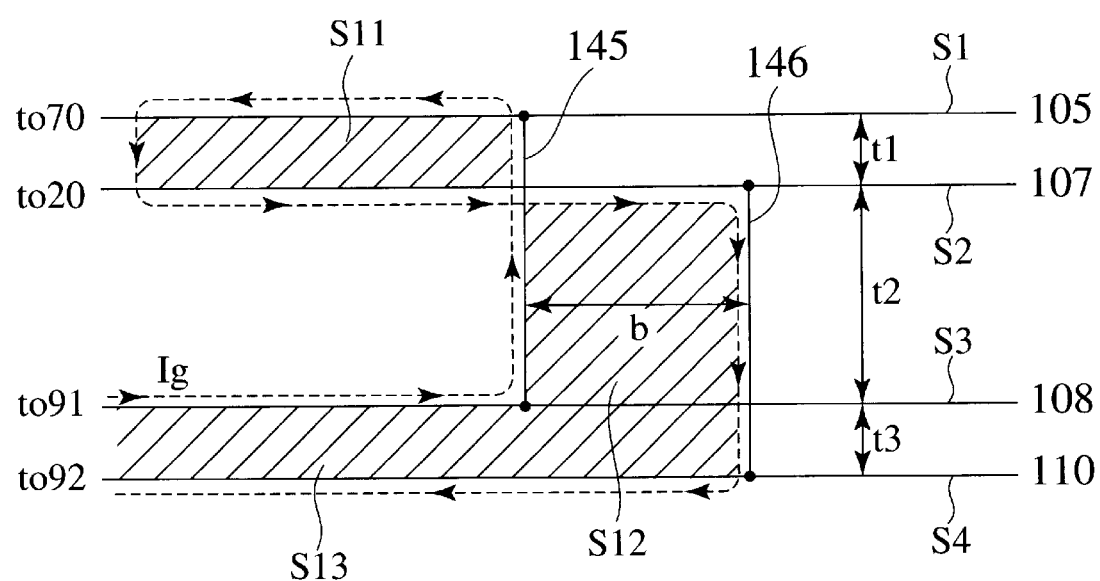
FIG. 14 is a circuit diagram of the area A1 of the circuit wiring board in FIG. 10B.

As shown in FIGS. 10B and 14, the gate current Ig sequentially flows in the gate terminal 91, the conductive films 108, 145, and 105, the connection conductor 70, the emitter copper post 20, the conductive films 107, 146, and 110, and the control emitter terminal 92. The circuit of the gate current IG is a parallel reciprocal circuit. The parallel reciprocal circuit has a pair of parallel conductors. In order to decrease the inductance of the parallel reciprocal circuit, the areas of the parallel conductors are increased, and the minimum area surrounded by the closed loop of the parallel reciprocal circuit. More specifically, the conductive films 105 and 107 are paired. In order to increase the areas S1 and S2 of the conductive films 105 and 107, the conductive films 105 and 107 are arranged around the insulating substrate 101. In order to decrease the minimum area S11 surrounded by the closed loop of the conductive films 105 and 107, the conductive films 105 and 107 are arranged opposite to each other. In addition, the insulating layer 106 is formed between the conductive films 105 and 107. The insulating layer 106 can be easily formed with a small thickness t1. The decrease of the film thickness t1 can make the minimum area S11 small.

Similarly, the conductor films 108 and 110 are paired. In order to increase areas S3 and S4, the conductive films 108 and 110 are arranged around the insulating substrate 101. In order to decrease the minimum area S13, the conductive films 108 and 110 are arranged opposite to each other. In addition, the insulating film 109 is formed between the conductive films 108 and 110 to decrease the film thickness t3.

Similarly, the conductive films 145 and 146 are paired. In order to decrease the minimum area S12 surrounded by the closed loop of the conductive films 105 and 107, a distance b between the conductive films 145 and 146 is decreased.

The through holes 140 and 141 are so densely arranged that the areas S1 to S4 of the rings 105a, 107a, 108a, and 110a are rarely reduced. The reductions of the areas S1 to S4 by the through holes 140 and 141 are preferably suppressed to 50% or less.

The through holes 140 and 141 are preferably arranged as closely as possible. For this reason, the through holes 140 and 141 are preferably arranged to be zigzag, planar array or alternately arrayed. In addition, in order to reduce the inductances of the rings 105a, 107a, 108a, and 110a, it is desired to make distances a1 and a2 of a pattern margin sufficiently smaller than the interval b between the through holes 140 and 141.

The conductive films 105, 108, and 145 and the conductive films 107, 110, and 146 are superposed and arranged in parallel to each other to make the direction of currents flowing therein different. In this manner, the inductances can be reduced, and the vibration of a gate-emitter voltage caused by feedback of the main current Ic can be suppressed.

In addition, the distance between the circuit board 100 and the bottom surface 21a of the emitter copper post 20 is preferably small. For this reason, the minimum area surrounded by the closed loop can be decreased. In particular, the circuit board 100 is preferably mounted to be closer to the bottom surface 21a of the emitter copper post 20 than the back surface of the semiconductor chip 10. The maximum point of a magnetic field produced by hte current of the emitter copper post 20 exists at an intermediate position between the back surface of the semiconductor chip 10 and the bottom surface 21a of the emitter copper post 20. As the magnetic field distance from the intermediate position increases, the magnetic field strength decreases. The circuit board 100 is arranged separately from the intermediate position. The circuit board 100 is mounted at a point which is close to the bottom surface 21a of the emitter copper post 20 than the intermediate position. The distance between the circuit board 100 and the lower surface of the column 22 is longer than the distance between the circuit board 100 and the upper surface 21 of the column 22. In this manner, affect of the magnetic field can be suppressed. The plane defined by extending the lower surface of the column 22 of the circuit board 100 corresponds to a plane defined by extending the bottom surface 21a.

Figure 15:
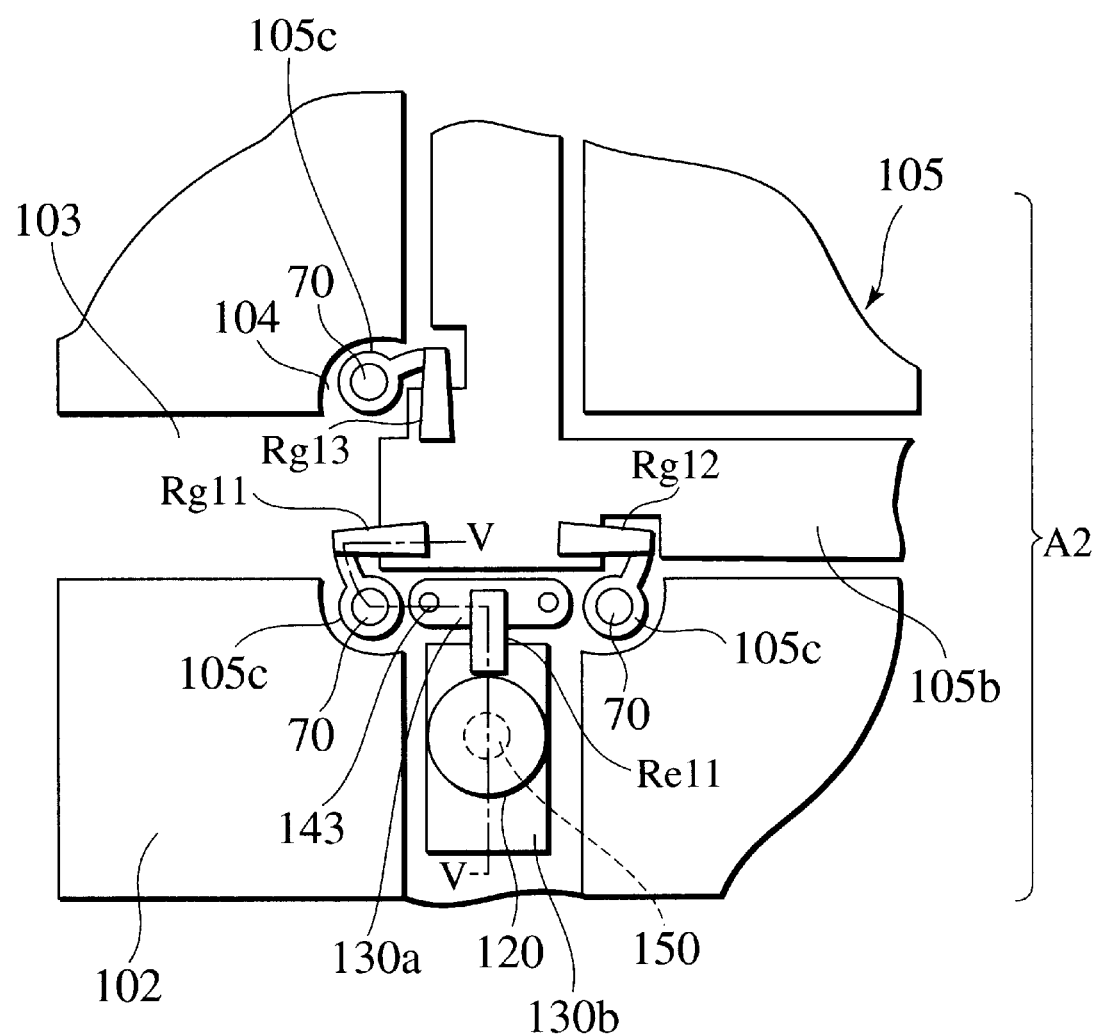
FIG. 15 is an enlarged view of an area A2 in FIG. 9 in the circuit wiring board of the power control semiconductor device of Embodiment 1.
Figure 16:
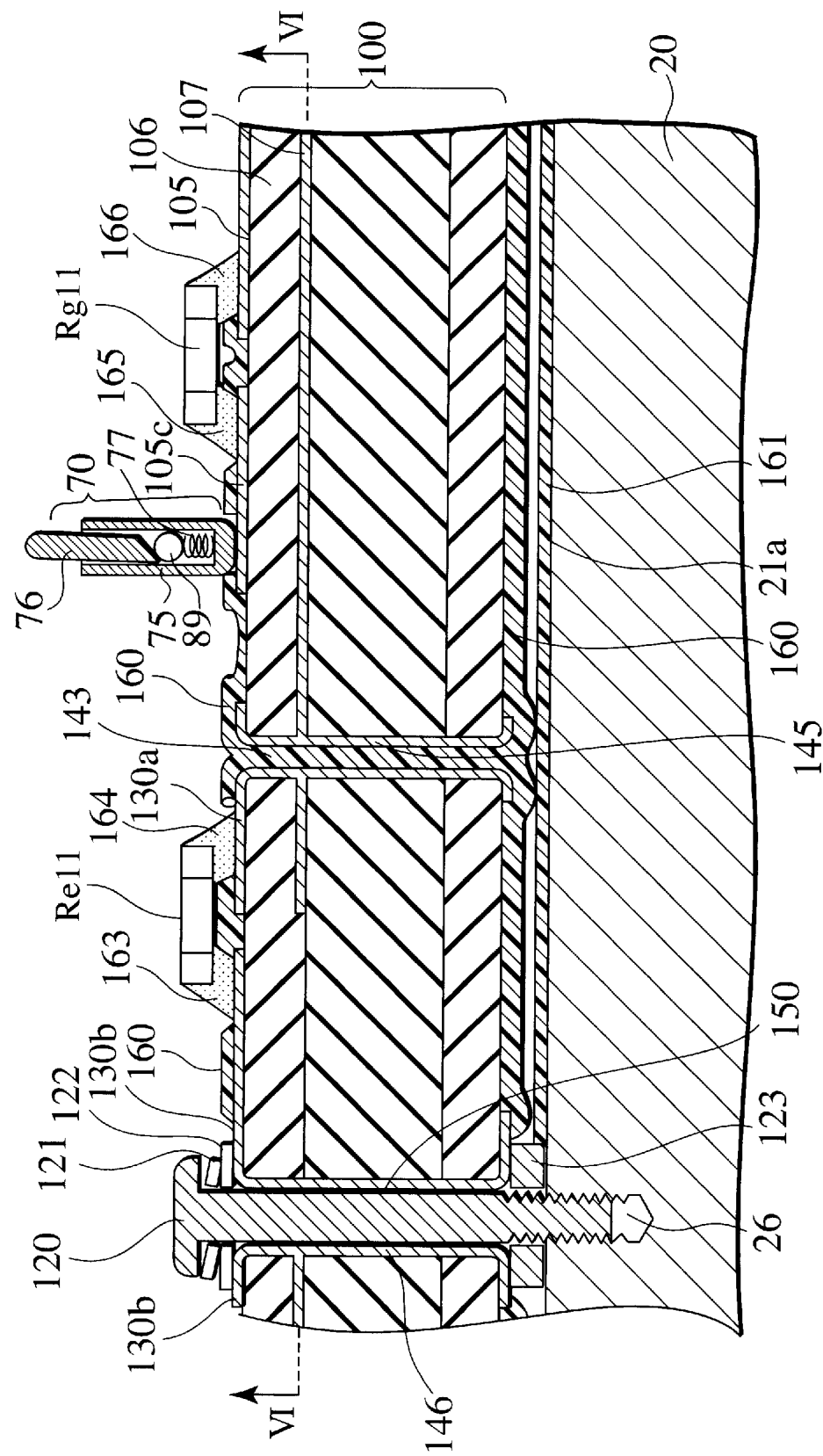
FIG. 16 is a sectional view along a V—V line in FIG. 15.
Figure 17:
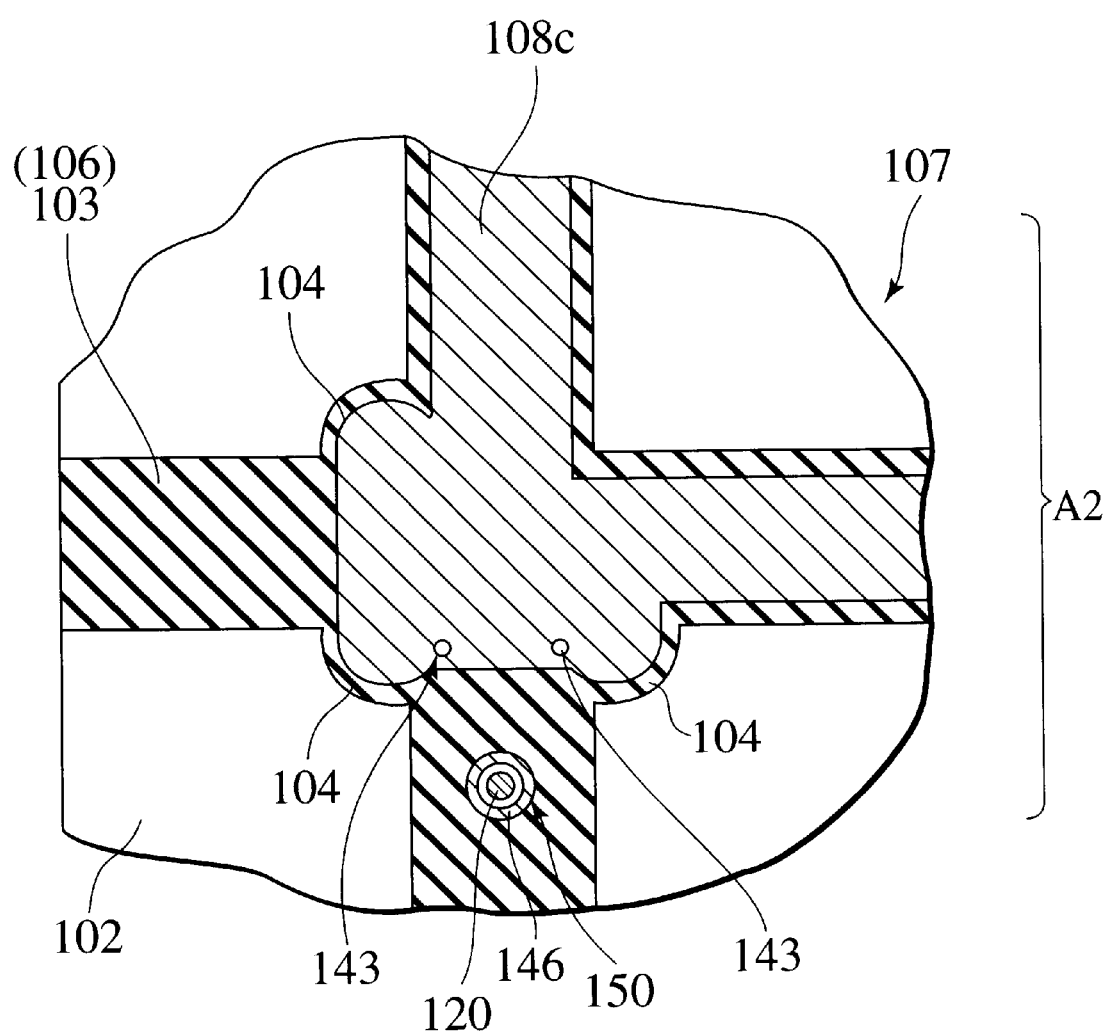
FIG. 17 is a sectional view along a line VI—VI in FIG. 16.

As shown in FIGS. 15 to 17, the circuit board 100 further has an emitter resistor Re11 and a plurality of gate resistors Rg11 to Rg13.

Pads 105c with which the connection conductors 70 are in contact are formed on the projecting portions 104 having an almost inverted-L shapes in the openings 102. The pads 105c are formed at positions opposing the gate electrodes 6 of the semiconductor chips 10. The pads 105c are connected to the branch 105b of the conductive film 105 through the gate resistors Rg11 to Rg13.

Plating such as gold-plating is applied to the surface of the pad 105c to prevent oxidation and reduce the contact resistance. Plating is also applied to an end of the connection conductor 70 with which the pad 105c is in contact.

The gate resistors Rg11 to Rg13 are fixed above the insulating layer 106 by solders 165 and 166. One end of the gate resistors Rg11 to Rg13 are electrically connected to the gate electrode 6 of the semiconductor chip 10. The other ends are electrically connected to the conductive film 105 and the gate terminal 91. One end of the gate resistors Rg11 to Rg13 are electrically connected to the pads 105c. The pads 105c are electrically connected to the connection conductor 70.

The resistance of the gate resistors Rg11 to Rg13 is preferably set at 5 Ω or less, in particular, 0.2 Ω or more and 1 Ω or less. The resistance of the resistor of a parallel circuit of resistors which are equivalent to the emitter resistor Re11 and are parallel to the semiconductor chips 10 is added to the resistor of the gate resistors Rg11 to Rg13. More specifically, the emitter resistor Re11 can be regarded as a parallel circuit constituted by three resistors which are parallel connected to the three semiconductor chips 10. Each of the resistances of the three resistors is three times the resistance of the emitter resistor Re11. A resistance which is three times the resistance of the emitter resistor Re11 is added to the resistance of the gate resistors Rg11 to Rg13. In this manner, the sum of resistances of the gate resistors Rg11 to Rg13 is set in the range of 0.2 to 1 Ω when the thickness of the insulating layers 106 and 109 is 50 μm. When the thickness of the insulating films 106 and 109 is 200 μm, the sum of the resistances of the gate resistors Rg11 to Rg13 is set in the range of 0.4 to 2 Ω. When the thickness of the insulating layers 106 and 109 is 500 μm, the sum of resistances of the gate resistors Rg11 to Rg13 is set in the range of 1 to 5 Ω.

When the sum of the resistances of the gate resistors Rg11 to Rg13 is set at about 0.1 to 1.5 Ù per chip, the vibration of the gate voltage can be suppressed as in the gate resistor Rg0 in FIG. 3. In particular, an inductance per chip of a so-called gate circuit between the gate terminal 91 and the control emitter terminal 92 is about 20 nH in the circuit board 100. For this reason, the sum of the resistances of the gate resistors Rg11 to Rg13 is desirably set at 0.2 Ω to 1 Ω. An inductance per chip is preferably set at 10 nH or less. For this purpose, the insulating layers 106 and 109 may be reduced in thickness. The thicknesses of the insulating layers 106 and 109 may be set at 30 μm or less.

The connection conductor 70 has an extendable pin structure. The connection conductor 70 electrically connects the gate electrode 6 of the semiconductor chip 10 to the pad 105c of the circuit board 100 by compression bonding. The connection conductor 70 has an electrically conductive sheath 75, a spring 77 which is an elastic member, a sphere 89 and an electrically conductive pin 76 having electric conductivity. The sheath 75 is perpendicularly arranged on the pad 105c. The sheath 75 is electrically connected to the pad 105c. As the spring 77, any elastic member, e.g., a rubber member or an air cushion may be used. The spring 77 is arranged in the sheath 75. The sphere 89 is arranged on the spring 77 in the sheath 75. The pin 76 is arranged in the sheath 75 to be electrically connected to the sheath 75. The pin 76 is perpendicularly arranged on the gate electrode 6. The pin 76 is electrically connected to the gate electrode 6. The sphere 89 is compression-bonded to the gate electrode 6.

The emitter resistor Re11 is fixed above the insulating layer 106 by solders 163 and 164. The emitter resistor Re11 has one end which is electrically connected to the emitter copper post 20. The other end is electrically connected to the conductive film 107 and the control emitter terminal 92.

Figure 18:
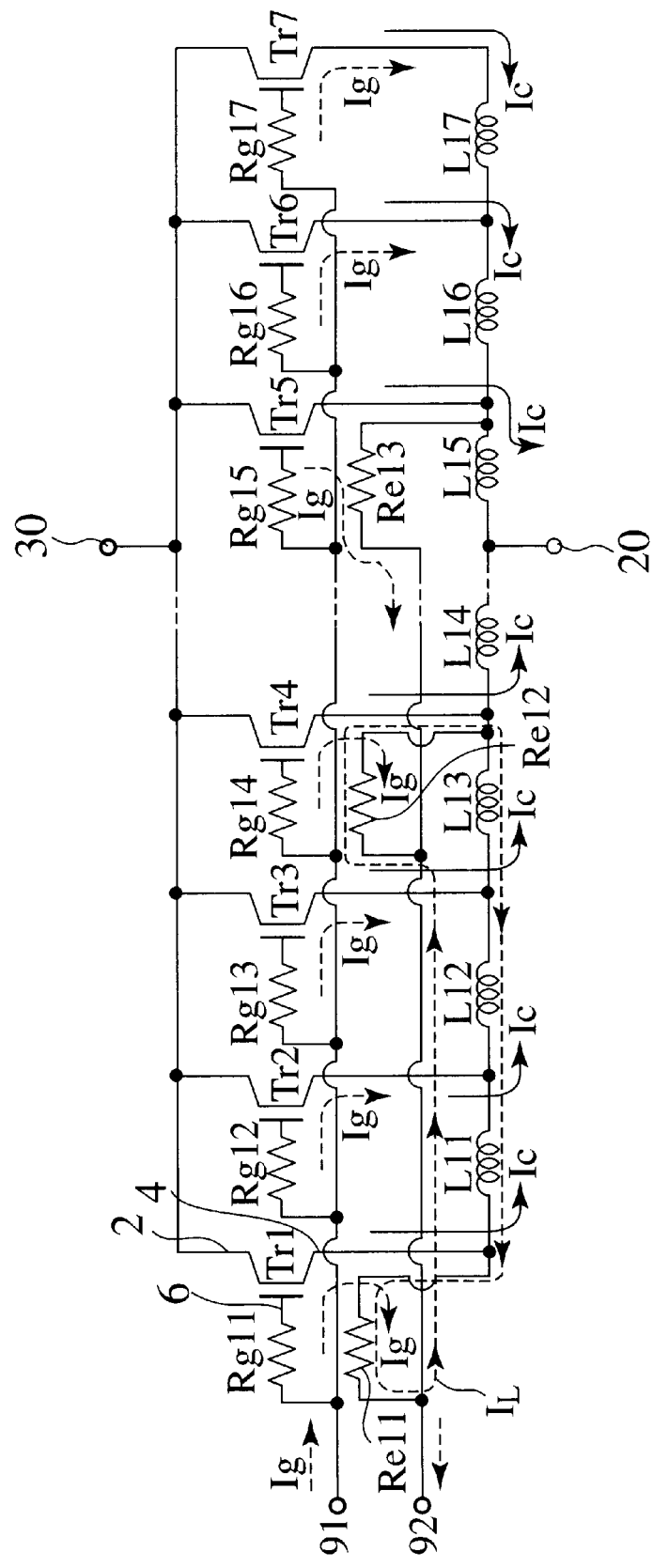
FIG. 18 is a circuit diagram of the power control semiconductor device of Embodiment 1.
Figure 19:
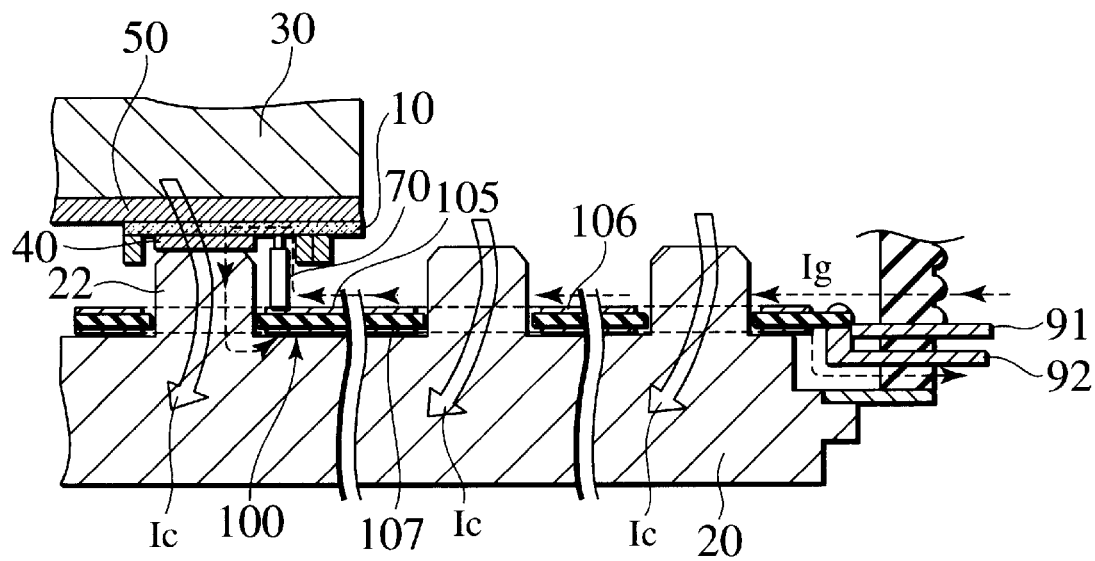
FIG. 19 is a pattern diagram of the power control semiconductor device of Embodiment 1 showing a route of a gate current.

The range of the resistance of the emitter resistor Re11 is equal to that of the sum of the resistance of the gate resistors Rg11 to Rg13. The emitter resistor Re11 also operates to regulate an induced current IL flowing in a loop circuit constituted by the emitter copper post 20 and the conductive film 107 of the circuit board 100. As shown in FIGS. 18 and 19, the power control semiconductor device of Embodiment 1 has transistors Tr1 to Tr7 such as IGBTs. The transistors Tr1 to Tr7 are arranged in each of the semiconductor chips 10. Each of the transistors Tr1 to Tr7 has a collector electrode 2, an emitter electrode 4, and a gate electrode 6. The collector electrodes 2 of the transistors Tr1 to Tr7 are connected in parallel to the collector copper post 30. The emitter electrodes 4 of the transistors Tr1 to Tr7 are connected in parallel to the emitter copper post 20. The gate electrodes 6 of the transistors Tr1 to Tr7 are connected to one end of gate resistors Rg11 to Rg17, respectively. The other ends of the gate resistors Rg11 to Rg17 are connected to the gate terminal 91. The emitter copper post 20 has parasitic inductances L11 to L17. The inductances of the parasitic inductances L11 to L17 are considered to be sufficiently small because the columns 22 are close to a conductive spacer 123. One end of the emitter resistor Re11 is connected to the emitter electrode 4 of the transistor Tr1. The other end of the emitter resistor Re11 is connected to the control emitter terminal 92. One end of an emitter resistor Re12 is connected to the emitter electrode 4 of the transistor Tr4. The other end of the emitter resistor Re12 is connected to the control emitter terminal 92. One end of an emitter resistor Re13 is connected to the emitter electrode 4 of the transistor Tr5. The other end of the emitter resistor Re13 is connected to the control emitter terminal 92.

A main current Ic sequentially flows in the collector copper post 30, the transistors Tr1 to Tr7, and the parasitic inductances L11 to L17. The main current Ic flows out of the emitter copper post 20. A gate drive circuit is connected between the gate terminal 91 and the control emitter terminal 92. A gate current Ig sequentially flows in the gate terminal 91, the gate resistors Rg11 to Rg17, the emitter resistors Re11 to Re13, and the control emitter terminal 92. The route of the gate current Ig overlaps the route of the main current Ic in the parasitic inductances L11 to L17. However, the inductances of the parasitic inductances L11 to L17 are sufficiently small, an induced electromotive force generated in the parasitic inductances L11 to L17 is sufficiently small. In this manner, the gate current Ig is rarely affected by the main current Ic.

When an induced electromotive force is generated in the parasitic inductances L11 to L17, an induced current IL sequentially flows in, e.g., the parasitic inductances L13, L12, and L11, the emitter resistors Re11 and Re12, and the parasitic inductance L13. The induced current IL decreases with time by the emitter resistors Re11 and Re12. In this manner, the gate current Ig is more rarely affected by the main current Ic.

Solders 163 to 166 may pose problems because of the melting point and environment. For this reason, a method in which the connections is established by another method such as welding, ultrasonic welding, or brazing is effective. The emitter resistor Re11 may be arranged on the back surface of the circuit board 100.

The conductive ring 123 electrically connects the conductive film 107 and the emitter copper post 20 to each other such that the circuit board 100 is fixed to the emitter copper post 20 by screws. The conductive ring 123 is arranged on the emitter copper post 20 near the connection conductor 70. The conductive ring 123 is electrically connected to the emitter copper post 20 and the conductive film 107. A through hole 150 is formed in the conductive ring 123 to penetrate the circuit board 100. The conductive film 146 is electrically connected to the conductive ring 123. A pad 130b is electrically connected to the conductive film 146, and the pad 130b is electrically connected to one terminal of the emitter resistor Re11. The pad 130a is electrically connected to the other end of the emitter resistor Re11.

In the frame 103 of the insulating substrate 101, the conductive films 130a and 130b are separately formed adjacent to the conductive film 105. The pad 130a is formed adjacent to the projecting portion 104. The conductive film 130b is formed between opposite sides of the adjacent openings 102. The conductive films 130a and 130b are electrically connected to each other through the emitter resistor Re11.

A through hole 143 is formed near the through hole 150. The through hole 143 penetrates the circuit board 100. The conductive film 145 is formed on the side wall of the through hole 143. The conductive film 145 is electrically connected to the pad 130a and the conductive film 107. The emitter copper post 20 has a screw hole 26 formed below the conductive ring 123. A screw 120 is fixed to the screw hole 26 through the conductive ring 123, the through hole 150, a washer 122, and a spring washer 121. The through holes 143 are formed on both ends of the pad 130a. There may be only one through holes 143. However, in order to improve reliability, two or more through holes 143 are preferably formed to provide redundancy.

On the circuit board 100, capacitors or inductors may be mounted on the conductive films 105, 105c, and 130b.

For a screw clamp, the spacer 123 may be formed on the bottom surface 21a of the emitter copper post 20 in place of the spacer 123 interposed on the back side of the circuit board 100. In addition to the screw clamp, a banana clip connected to the circuit board 100 by soldering or the like or a metal terminal having an anti-drop stopper may be used. When the banana clip or the like is connected to the screw hole 26, labor for mounting can be considerably saved. At this time, screw-thread cutting need not be performed on the hole 26.

The upper surface and the back surface of the circuit board 100 are insulated and protected by a solder resist 160. On the back surface side, an insulating sheet 161 is adhered on the emitter copper post 20. When the back surface of the circuit board 100 has an uneven surface or parts such as emitter resistors formed thereon, the insulating sheet 161 is further interposed. In this manner, the reliability is greatly improved.

A gate current Ig19 passes through the column 22 and is guided to the circuit board 100 through the screw 120 arranged on the bottom surface 21a near the root of the column 22. More specifically, the route of the gate current Ig passing through the emitter copper post 20 can be omitted. Therefore, the gate current Ig is rarely affected by the main current Ic, and the turn-off current capability is improved without producing vibration and nonuniformity of the gate signal. Damage to the semiconductor chips 10 can be prevented by this arrangement.

Modification of Embodiment 1

Figure 20:
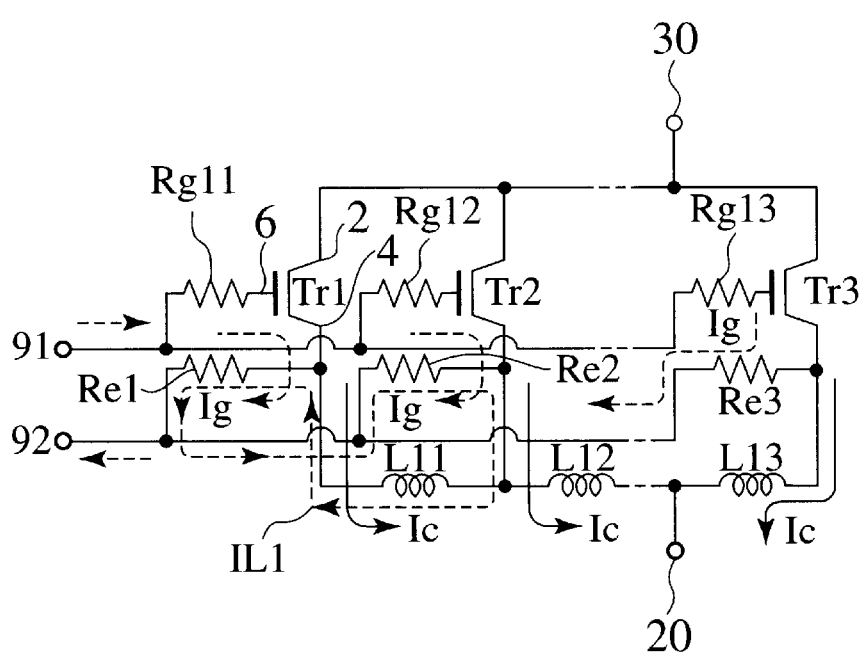
FIG. 20 is a circuit diagram of a power control semiconductor device according to a modification of Embodiment 1.

A power control semiconductor device according to a modification of Embodiment 1 is different from the power control semiconductor device of Embodiment 1 in FIG. 18 in that, as shown in FIG. 20, the emitter resistors Re11 to Re13 and emitter resistors Re1 to Re3 are provided. The resistance of the emitter resistors Re1 to Re3 is three times the resistance of the emitter resistors Re11 to Re13.

The emitter resistors Re1 to Re3 also operate to regulate an induced current IL flowing in a loop circuit constituted by the emitter copper post 20 and the conductive film 107 of the circuit board 100. As shown in FIG. 20, the transistors Tr1 to Tr3 are arranged on each of the semiconductor chips 10. The emitter copper post 20 has parasitic inductances L11 to L13. The inductance of the parasitic inductances L11 to L13 is considered to be sufficiently small because the columns 22 are close to a conductive spacer 123. One end of the emitter resistors Re1 to Re3 is connected to the emitter electrodes 4 of the transistors Tr1 to Tr3. The other ends of the emitter resistors Re1 to Re3 are connected to the control emitter terminal 92.

A main current Ic sequentially flows in the collector copper post 30, the transistors Tr1 to Tr3, and the parasitic inductors L11 to L13. The main current Ic flows out of the emitter copper post 20. A gate drive circuit is connected between the gate terminal 91 and the control emitter terminal 92. A gate current Ig sequentially flows in the gate terminal 91, the gate resistors Rg11 to Rg13, the emitter resistors Re1 to Re3, and the control emitter terminal 92. The route of the gate current Ig overlaps the route of the main current Ic in the parasitic inductors L11 to L13. However, the inductances of the parasitic inductors L11 to L13 are sufficiently small, an induced electromotive force generated in the parasitic inductors L11 to L13 is sufficiently small. In this manner, the gate current Ig is rarely affected by the main current Ic.

When an induced electromotive force is generated in the parasitic inductors L11 to L13, an induced current IL sequentially flows in, e.g., the parasitic inductor L11, the emitter resistors Re1 and Re2, and the parasitic inductor L11. The induced current IL1 decreases with time by the emitter resistors Re1 and Re2. In this manner, the gate current Ig is even more rarely affected by the main current Ic.

A resistance obtained by adding the resistance of the emitter resistor Re11 to the resistance of the gate resistors Rg11 to Rg13 in Embodiment 1 is equal to a resistance obtained by adding the resistance of the emitter resistors Re1 to Re3 to the resistance of the gate resistors Rg11 to Rg13 in the modification of the Embodiment 1. However, since an emitter resistance with respect to the induced current IL1 is three times an emitter resistance with respect to the induced current IL, the damping capacity of the induced current IL1 is large.

Embodiment 2

Figure 21:
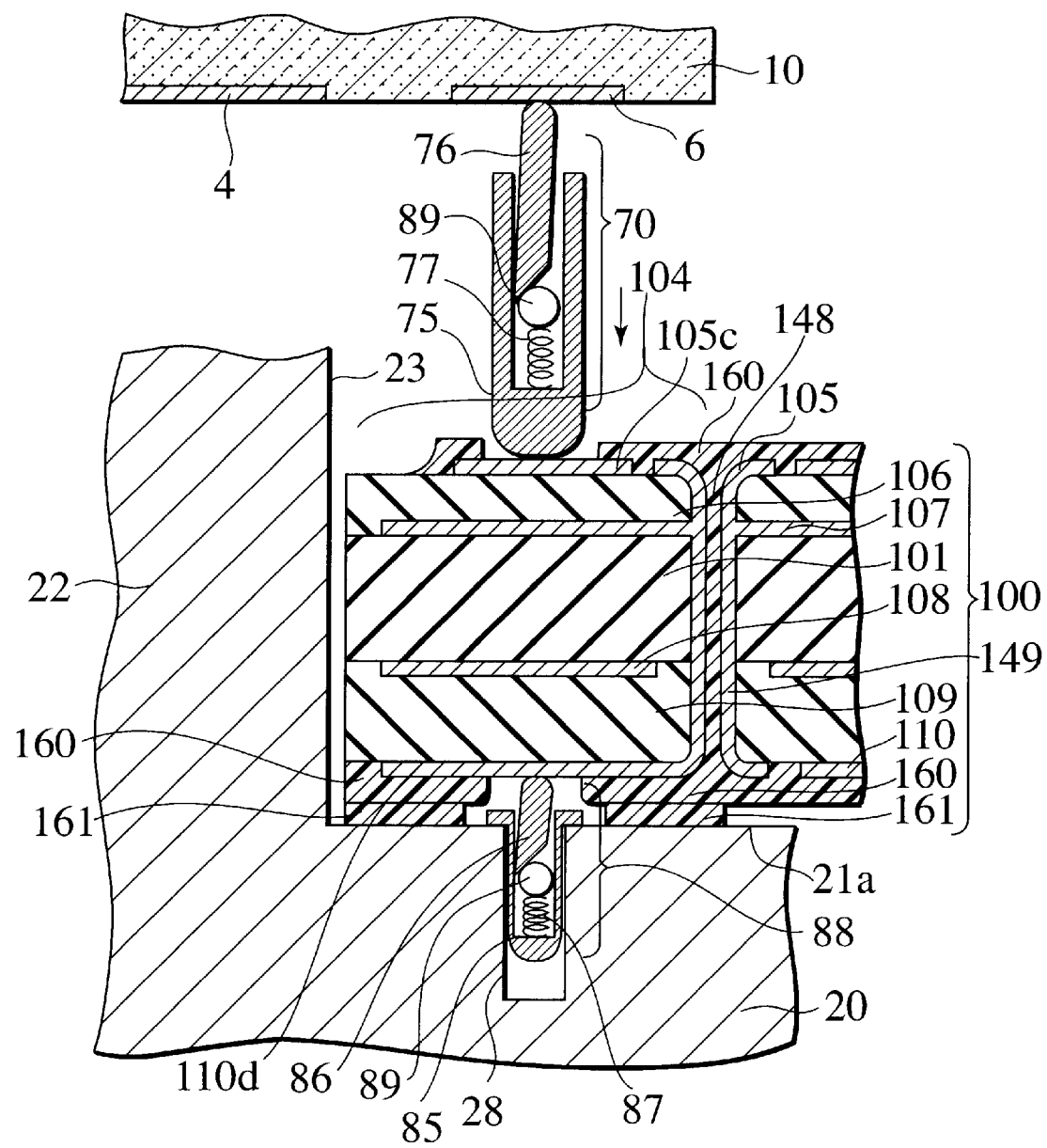
FIG. 21 is a sectional view of an power control semiconductor device according to Embodiment 2 of the present invention.

A power control semiconductor device according to Embodiment 2 is different from the power control semiconductor device of Embodiment 1 shown in FIG. 16 in that, as shown in FIG. 21, a connection conductor 88 is used in place of the screw 120.

The connection conductor 88 is electrically connected to the emitter copper post 20 and the conductive film 107. The connection conductor 88 opposes the connection conductor 70 through the circuit board 100. The connection conductor 88 has a sheath 85, a spring 87, a sphere 89 and a pin 86. The sheath 85 is electrically connected to the pad 105c. As the spring 87, any elastic member, e.g., a rubber member or an air cushion may be used. The sphere 89 is arranged on the spring 87 in the sheath 85. The pin 86 is electrically connected to a pad 110d and the conductive film 107. The pin 86 compresses the spring 87 and is compression-bonded to the pad 110d. The sheath 85 may be electrically connected to the conductive film 107. At this time, the pin 86 is electrically connected to the emitter copper post 20.

On the pad 110d of the circuit board 100, the insulating layer 106 and the insulating sheet are removed. The pad 110d is exposed. A pad lid is located immediately below the pad 105.

The emitter copper post 20 has a hole 28 to which the connection conductor 88 is fixed. The connection conductor 88 is fitted in the hole 28. The pads 105c and 110d are formed on the projecting portion 104 of the circuit board 100. The hole 28 is formed in the bottom surface 21a of the recessed side surface 24 of the column 22.

Since a magnetic effect from the column 22 can be reduced as the circuit board 100 becomes close to the bottom surface 21a, the circuit board 100 is prevented from floating from the bottom surface 21a. For this reason, the pin pressure of the connection conductor 88 is preferably made smaller than the pin pressure of the connection conductor 70.

The maximum quantity of impact is represented by G, the weight of the circuit board 100 is represented by W, the number of connection conductors 70 is represented by ng, the number of connection conductors 88 is represented by ne, the pin pressure of the connection conductor 70 in design compression is represented by pg, and the pin pressure of the connection conductor 88 in design compression is represented by pe. In this case, the following relational expression must be satisfied:

$$G*W < ng*pg - ne*pe \quad (1)$$

For example, G is given by 50 G (no dimension), W is given by 10 g, and ne and ng are given by 16 each. In this case, a compression difference (pg−Pe) between the connection conductors 88 and 70 must be 31.2 g or more.

When the weight wp of the connection conductor 70 is considered, the following relational expression (2) must be more exactly satisfied. This case corresponds to a case in which the circuit board 100 is constituted by an imide film and has a very light weight, a case in which the connection conductor 70 increases in weight, or the like.

$$G*(W+ng*wp) < (ng+ne)*pg - ne*pe \quad (2)$$

According to the power control semiconductor device of Embodiment 2, as in the power control semiconductor device of Embodiment 1, vibration of the gate current Ig or the main current Ic is not generated, and the main current Ic is not easily concentrated. Therefore, the semiconductor chip 10 is not easily damaged. Since the connection conductors 70 and 88 are arranged at the same positions to sandwich the circuit board 100, the inductance can be more reduced.

No bending stress acts on the circuit board 100, and the reliability is improved. Further, the stroke of the connection conductor 70 is not shortened by bending strain of the circuit board 100.

In addition, the number of times the circuit wiring board is screwed down in manufacture of the power control semiconductor device decreases, and the cost can be reduced. Screw-thread cutting need not be performed on the hole 28.

Addition to Comparative Example 1

Figure 22A:
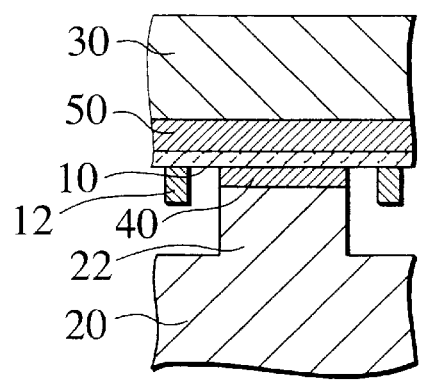
FIG. 22A is a sectional view of a power control semiconductor device according to Comparative Example 1.

In the power control semiconductor device of Comparative Example 1, as indicated by the region Y in FIG. 1 and in FIG. 22A, The emitter copper post 20, the emitter buffer plate 40, the semiconductor chip 10, the collector buffer plate 50, and the collector copper post 30 sequentially overlap. The emitter copper post 20, the emitter buffer plate 40, the semiconductor chip 10, and the collector buffer plate 50, and the collector copper post 30 are compression-bonded to each other.

Figure 23:
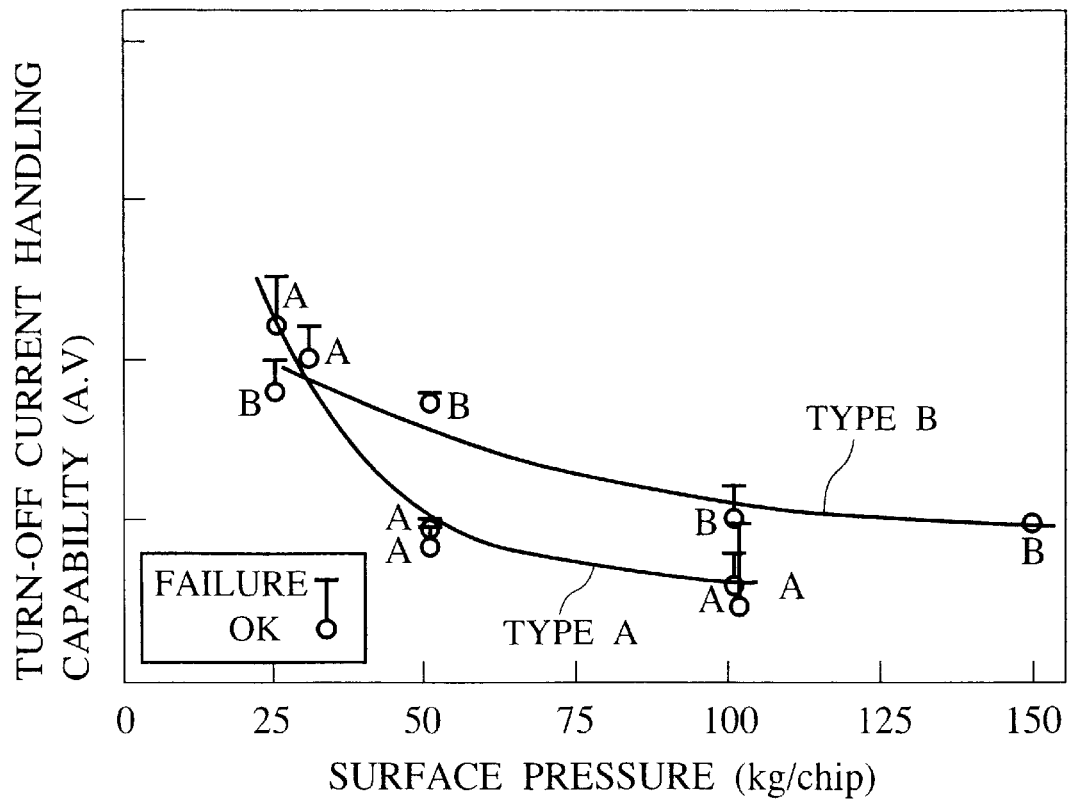
FIG. 23 is a graph showing a relationship between the turn-off current handling capability and surface pressures on semiconductor chips of power control semiconductor devices according to Comparative Example 1 and Comparative Example 2.

As shown in FIG. 23, a mark o indicates the maximum main current value at which switching is performed. A mark − indicates the minimum main current value at which switching cannot be performed. It is considered that the turn-off current handling capability falls in the range of the maximum main current value, at which switching is performed, to the minimum value at which switching cannot be performed.

As shown in type A in FIG. 23, in the power control semiconductor device of Comparative Example 1, an increase in compression-bonding force used for compression bonding considerably decreases the turn-off current handling capability. In particular, when a compression-bonding force per chip increases from 25 kg to 50 kg, the turn-off current handling capability sharply decreases. When the compression-bonding force per chip is larger than 50 kg and smaller than 100 kg, the turn-off current handling capability moderately decreases.

Comparative Example 2

Figure 22B:
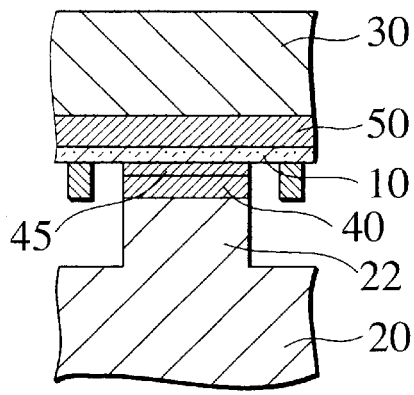
FIG. 22B is a sectional view of a power control semiconductor device according to Comparative Example 2.

The power control semiconductor device of Comparative Example 1 is different from a power control semiconductor device shown in FIG. 22A in that, as shown in FIG. 22, a silver foil 45 is arranged between the emitter buffer plate 40 and the semiconductor chip 10.

As shown in Type B in FIG. 23, in the power control semiconductor device of Comparative Example 2, when a compression-bonding force for compression bonding increases, the turn-off current handling capability decreases. The degree of decrease of Type B is smaller than the degree of decrease of Type A. For this reason, the present inventors paid attention to compression-bonding surfaces of the emitter buffer plate 40 and the semiconductor chip 10 between which the silver foil 45 is inserted.

The emitter buffer plate 40 is die-cut by punching. In addition, in the emitter buffer plate 40, any projecting portion, such as a burr, is removed in any acceptable manner.

Figure 24:
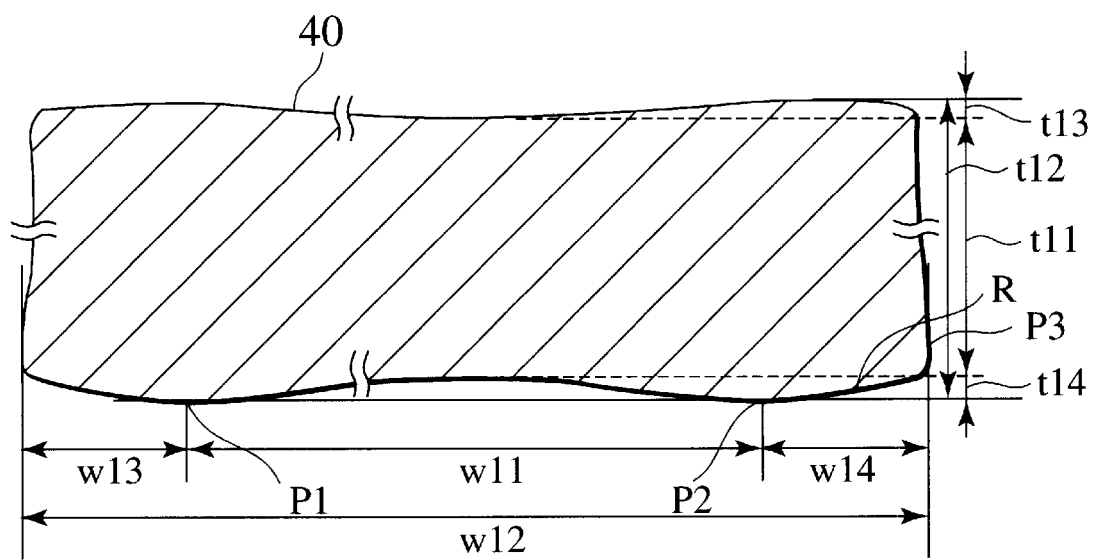
FIG. 24 is a sectional view of an emitter buffer plate of the power control semiconductor device of Comparative Example 1.

For this reason, as shown in FIG. 24, in the emitter buffer plate 40, a thickness of a portion near a surface cut, i.e., the plate thickness t12 of peripheral portions P1 and P2 of the emitter buffer plate 40 is larger than the plate thickness t11 of the central portion by about 0.5 to 2.0 μm due to die blade punching. Furthermore, the corner of a peripheral edge P3 of the emitter buffer plate 40 is changed into a curved surface R.

On the other hand, the collector buffer plate 50 is manufactured by a cutting method. For this reason, in the collector buffer plate 50, peripheral portions P1 and P2 increase in thickness, and a peripheral edge P3 does not have a curved surface R.

It is considered that the semiconductor chip 10 is compression-bonded to the emitter buffer plate 40 and the bonding concentrates a surface pressure on a surface portion of the semiconductor chip 10 which is in contact with the peripheral portions P1 and P2 of the emitter buffer plates 40.

It is estimated that the turn-off current handling capability is decreased by breakdown of the semiconductor chip 10. The breakdown of the semiconductor chip 10 also occurs at a position where a dent is formed by strongly compression-bonding the emitter buffer plate 40. It is considered that the semiconductor chip 10 is easily damaged at a position where the pressure on the semiconductor chip 10 is concentrated. Although the present inventors did not know the mechanism that causes a pressure to damage the semiconductor chip 10, the present inventors estimated the mechanism as follows.

In general, the following fact is known. That is, in the semiconductor chip 10 having an npn transistor structure, a pressure on a collector side increases the gain of the transistors, and a pressure on an emitter side decreases the gain. See references 1–4 as follows.

(Reference 1: W. Rinder, "Resistance of Elastically Deformed Shallow p-n Junction", J. Appl. Phys., vol. 33, pp. 2479–2480, 1962.

Reference 2: W. Rinder and Braum, "Resistance of Elastically Deformed Shallow p-n Junction, part. II," J. Appl. Phys., vol. 35, pp. 2122–2131, 1964.

Reference 3: J. J. Wortman, J. R. Iiauser, and R. M. Burger "Effect of Mechanical Stress on p-n Junction Device Characteristics," J. Appl. Phys., vol. 35, pp. 2122–2131, 1964.

Reference 4: R. Edwards, "Some Effect of Localized Stress on Silicon Planar Transistors," IEEE Trans. on ED, vol. ED-II, pp. 286–294, 1964.)

In the power control semiconductor device of Comparative Example 1, it is considered that a portion which is strongly pressured is brought into contact with the collector of a parasitic transistor constituted by a source, a p-type base, and an n-type base to increase the gain of the parasitic transistor at the strongly pressured portion.

An increase in gain of the parasitic transistor easily sets a parasitic thyristor constituted by an n-type source, a p-type base, an n-type base, and a p-type emitter in an ON state, and the main current Ic cannot be cut off by a MOS gate. In particular, when the surface of the semiconductor chip 10 has a portion on which a strong pressure is localized, the parasitic thyristor is easily turned on, and the main current Ic cannot be cut off by the MOS gate.

On the other hand, since the main current Ic is cut off by the MOS gate at another portion, the main current Ic which should flow in another portion is also concentrated on the strongly pressured portion. A thyristor operation spreads from the strongly pressured portion to other portions. The semiconductor chip 10 causes a latch-up phenomenon and causes a turn-off failure. The semiconductor chip 10 is damaged and the turn-off current capability decreases.

Embodiment 3 and Modification Thereof

Figure 25:
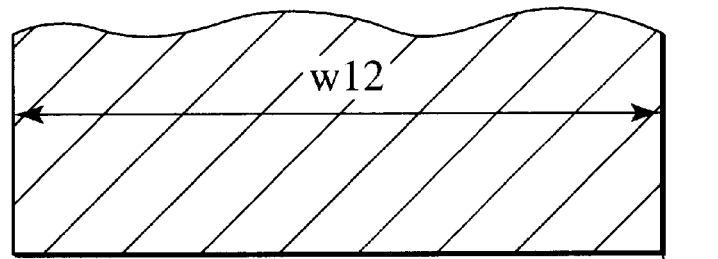
FIG. 25 is a sectional view of an emitter buffer plate of a power control semiconductor device according to Embodiment 3.
Figure 28:
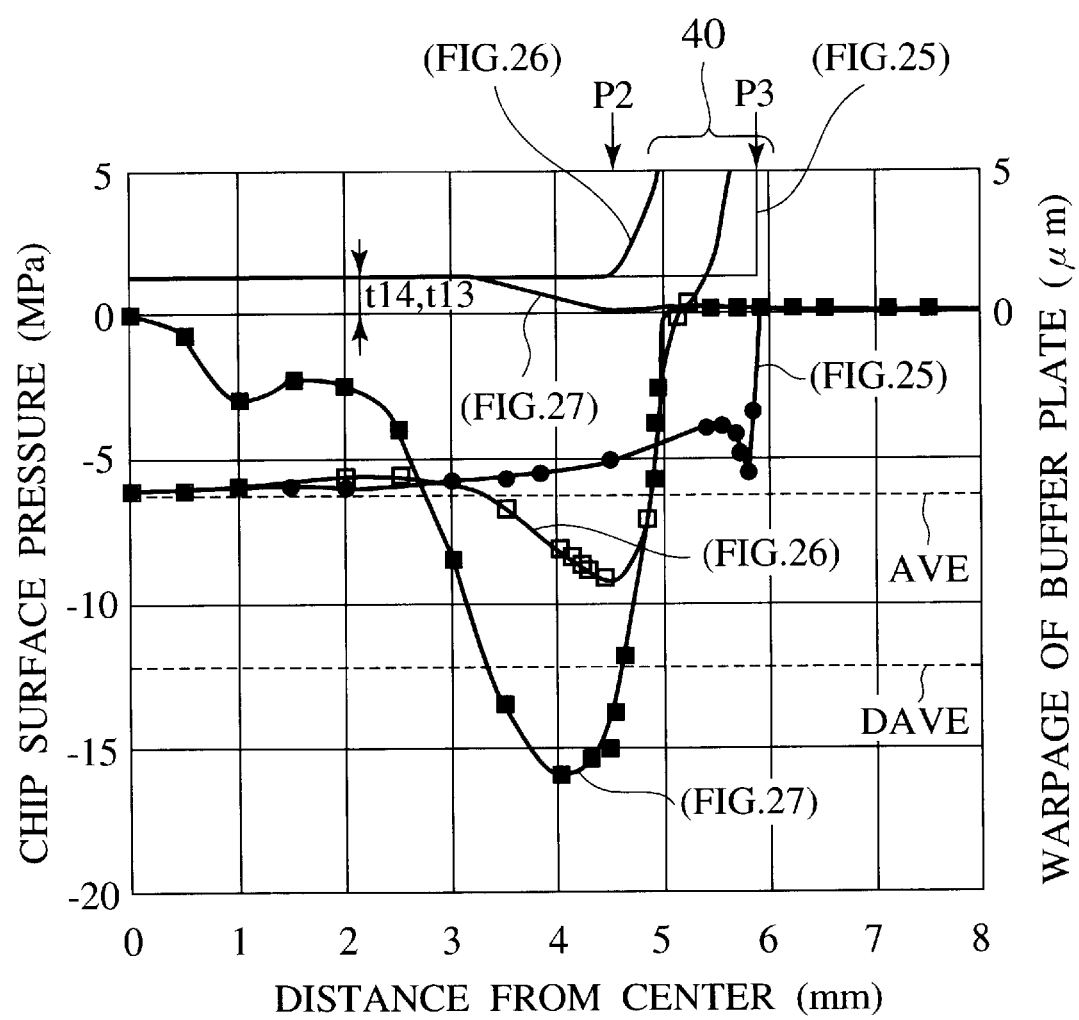
FIG. 28 is a graph showing a relationship between a surface pressure on the semiconductor chip and a distance from the center of the emitter buffer plate of the power control semiconductor device of Embodiment 3.

A power control semiconductor device according to Embodiment 3 is different from the power control semiconductor device of Comparative Example 1 shown in FIGS. 22A and 24 in the shapes of the emitter buffer plates 40. As shown in FIGS. 25 and 28, the lengths w12 of the emitter buffer plates 40 of Embodiment 3 and Comparative Example 1 are equal to 11.6 mm. Peripheral edge P3 of the emitter buffer plates 40 of Embodiment 3 has a corner. The front and back surfaces between the peripheral portions P1 and P2 of the emitter buffer plates 40 of Embodiment 3 are planar surfaces.

Figure 26:
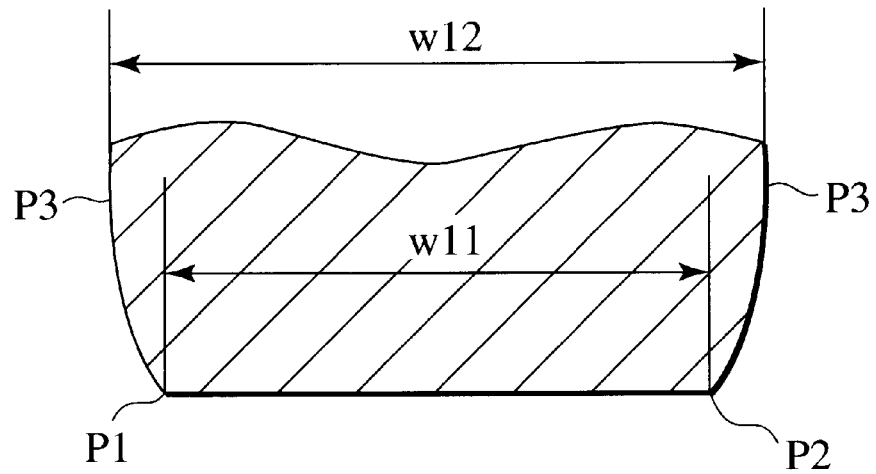
FIG. 26 is a sectional view of an emitter buffer plate of a power control semiconductor device according to a modification of Embodiment 3.

A power control semiconductor device according to Modification of Embodiment 3 is different from the power control semiconductor device of Comparative Example 1 in the shapes of the emitter buffer plates 40. As shown in FIGS. 26 and 28, the length w12 of the emitter buffer plates 40 of Embodiment 3 and Modification of Embodiment 3 are equal to 11.6 mm. Peripheral edge P3 of the emitter buffer plates 40 of Modification of Embodiment 3 has a curved surface R. The thickness of the emitter buffer plate 40 of Modification of Embodiment 3 is uniform in the plate between the peripheral portions P1 and P2. The distance between the peripheral portions P1 and P2 is 9.0 mm. The front and back surfaces between the peripheral portions P1 and P2 are not warped.

Figure 27:
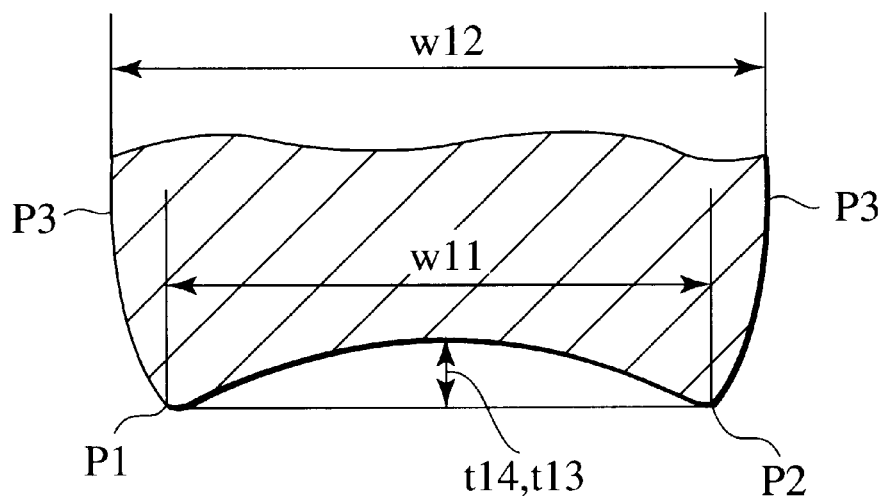
FIG. 27 is a pattern diagram of a section of the emitter buffer plate of the power control semiconductor device of Comparative Example 1.

Even in the power control semiconductor device of Comparative Example 1, as shown in FIGS. 27 and 28, the length w12 of the emitter buffer plate 40 is 11.6 mm. The peripheral portion P3 of the emitter buffer plate 40 has the curved surface R. The peripheral portions P1 and P2 of the emitter buffer plate 40 are higher than the central portion by heights t14 and t13, respectively. The heights t14 and t13 are set at 1 μm each. The front and back surfaces between the peripheral portions P1 and P2 are warped. When the power control semiconductor devices of Embodiment 3, Modification, and comparative Example 1 are compared with each other, the following is understood. That is, the area of the plane surface in Embodiment 3 is largest, the area of the plane surface in Modification is second largest, and the area of the plane surface in Comparative Example 1 is smallest.

With respect to the power control semiconductor devices of Embodiment 3, Modification, and Comparative Example 1, as shown in FIG. 28, the distribution of a surface pressure put on the semiconductor chip 10 was calculated by simulation as shown in FIG. 28.

In the power control semiconductor device of Embodiment 3, a pressure on the surface of the semiconductor chip 10 is almost uniform. The pressure is equal to a pressure average AVE.

In the power control semiconductor device of Modification of Embodiment 3, a stress at the central portion is equal to the pressure average AVE. The stresses of the peripheral portions P1 and P2 are 1.5 times the pressure average AVE.

In the power control semiconductor device of Comparative Example 1, a stress on the central portion is zero, and does not reach the pressure average AVE. The maximum value of the stress near the peripheral portions P1 and P2 is 2.7 times (DAVE) the pressure average AVE. In contrast to this, it is considered that, when pressures for compression-bonding the peripheral portions P1 and P2 to the semiconductor chip 10 are equal to or smaller than twice (DAVE) the average of pressures for compression-bonding the semiconductor chip 10, nonuniformity of a surface pressure put on the semiconductor chip 10 can be reduced.

When the front and back surfaces of the emitter buffer plate 40 are not warped, and are planar, the nonuniformity of a surface pressure put on the semiconductor chip 10 can be reduced. In this manner, the main current Ic is not easily concentration on the inside of the semiconductor chip 10. Therefore, the semiconductor chip 10 is not damaged, and the turn-off current handling capability of the power control semiconductor device does not decrease.

Embodiment 4

Figure 29A:
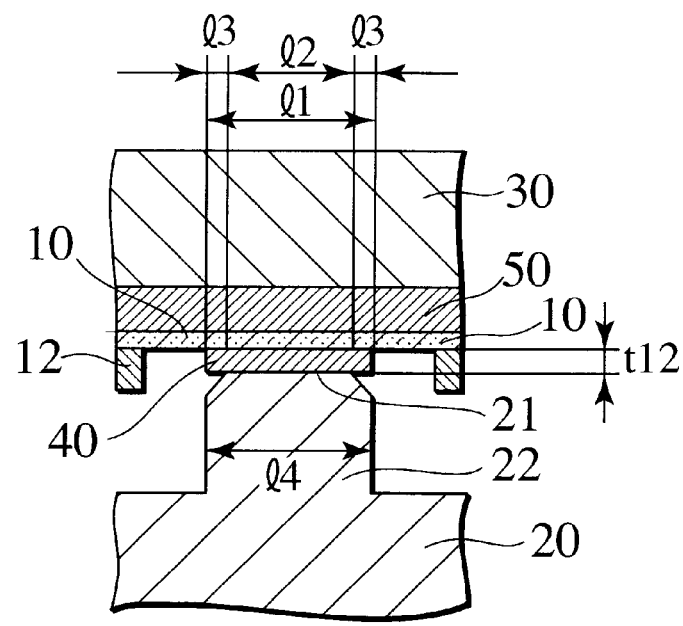
FIG. 29A is a sectional view of a power control semiconductor device according to Embodiment 4.
Figure 29B:
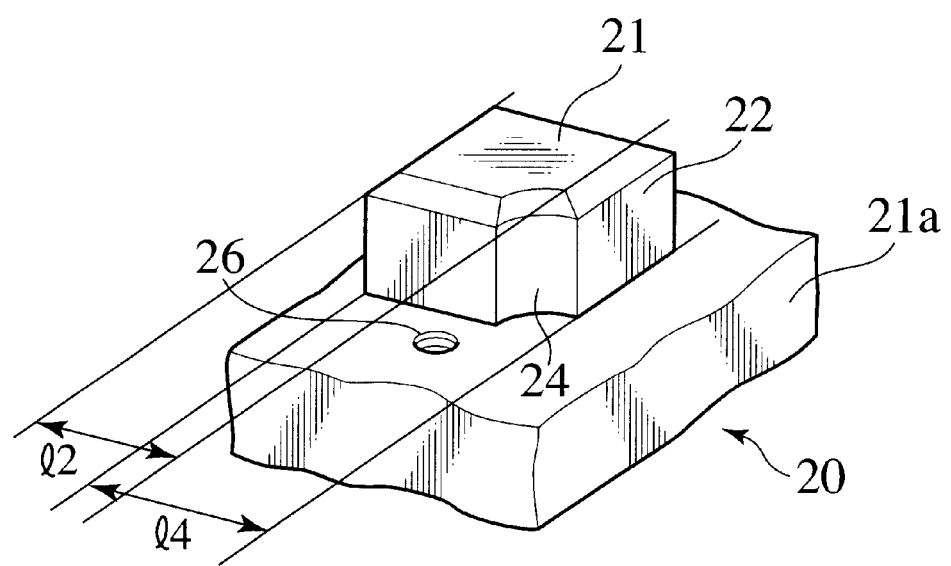
FIG. 29B is a perspective view of an emitter copper post of the power control semiconductor device of Embodiment 4.

A power control semiconductor device according to Embodiment 4 is different from the power control semiconductor device of Comparative Example 1 in FIG. 22A in, as shown in FIGS. 29A and 29B, the shapes of the columns 22 of the emitter copper posts 20.

The width 12 of the upper surface 21 which is a contact region between the column 22 and the emitter buffer plate 40 is smaller than the width 11 of the surface of the emitter buffer plate 40 which is a contact region between the emitter buffer plate 40 and the semiconductor chip 10. The width 12 of the upper surface 21 which is the contact region between the column 22 and the emitter buffer plate 40 is smaller than the width 14 of the column 22. A surface pressure applied on the semiconductor chip 10 in compression bonding becomes almost uniform, and current concentration is prevented. The semiconductor chip 10 is prevented from being damaged. The turn-off current handling capability is not decreased by compression bonding.

The thickness t12 of the emitter buffer plate 40 preferably falls within the range of about 0.3 to 25 mm. This is because the emitter buffer plate 40 having a thickness of 0.3 mm or less is easily affected by thermal expansion of the emitter copper post 20 and because the emitter buffer plate 40 having a thickness of more than 2.5 mm has a large thermal resistance.

The upper surface 21 of the column 22 is formed to have the same shape as that of the surface of the emitter buffer plate 40. The upper surface 21 of the column 22 is formed to have an area smaller than that of the emitter buffer plate 40.

The emitter buffer plate 40, as shown in FIG. 24, has thick peripheral portions P1 and P2 and a curved surface R.

The present inventors performed various experiments to consider a range of the plate thickness which is increased by punching. As a result, the present inventors confirmed that the range in which the emitter buffer plate 40 is thick is related to the plate thickness t12 and that a portion of the emitter buffer plate 40 spaced from the edge toward the inside is very frequently thick, i.e., about 85% of the plate thickness t12.

The present inventors considered that the contact area between the column 22 and the emitter buffer plate 40 is made smaller than the contact area between the emitter buffer plate 40 and the semiconductor chip 10 to compression-bond the semiconductor chip 10 by the column 22 around the thick portion of the emitter buffer plate 40.

The corners of the upper end of the column 22 are chamfered over the circumference. In this manner, the area of the upper surface 21 is reduced. The upper surface 21 is formed to have an area smaller than that of the emitter buffer plate 40. The structure of the column 22 is called a chamfered structure. More specifically, the upper surface of the column 22 is formed to have an area smaller than that of the emitter buffer plate 40 and to pass over the thick portion of the peripheral portion of the emitter buffer plate 40. The area of the upper surface 21 is made smaller than the contact area between the emitter buffer plate 40 and the semiconductor chip 10. In the emitter buffer plate 40, a region spaced from the edge by a distance 13 which is 86% of the thickness t12 is separated from the emitter copper post 20.

Figure 30:
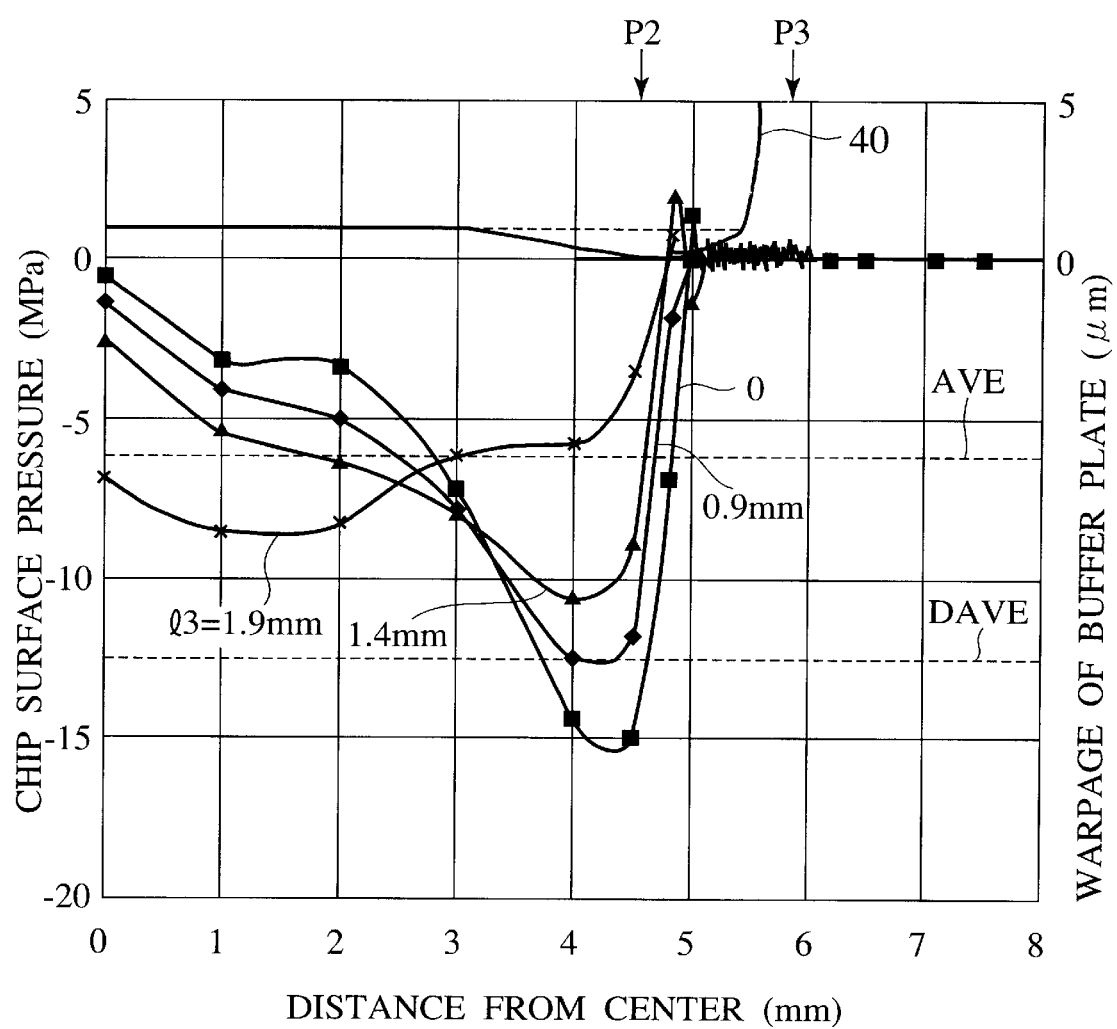
FIG. 30 is a graph showing a relationship between a surface pressure on a semiconductor chip and a distance from the center of the emitter buffer plate of the power control semiconductor device of Embodiment 4.

The present inventors used simulation to calculate a surface pressure distribution of the semiconductor chip 10 obtained by a notch width 13 as shown in FIG. 30.

The surface of the emitter buffer plate 40 was square. The plate thickness t12 of the emitter buffer plate 40 in FIG. 24 was set at about 1.5 mm. Vertical and horizontal widths w12 were set at 11.6 mm each. The distance w11 between the thick peripheral portions P1 and P2 was set at about 9 mm. A compression-bonding force was set at 1500 N per chip 10. The notch width 13 was set to 0 mm, 0.9 mm, 1.4 mm, and 1.9 mm.

The case in which the notch width 13 was 0 mm corresponded to Comparative Example 1 in FIG. 28. The calculation in the case was exactly equal to the calculation in Comparative Example 1 in FIG. 28. The surface pressure has a peak in the region spaced from the edge of the emitter buffer plate 40 toward the inside by about 1 mm to 2 mm. In contrast to this, a portion near the center of the emitter buffer plate 40 has a small surface pressure and is disadvantageous in heat radiation.

When the notch width 13 is 0.9 mm, the notch width 13 corresponds to 60% of the plate thickness t12 with reference to the edge of the emitter buffer plate 40. A stress at the central portion when the notch width 13 is 0.9 mm is larger than that when the notch width 13 is 0 mm. The stress at the central portion is smaller than the pressure average AVE. Stresses at the peripheral portions P1 and P2 are 2.0 times (DAVE) the pressure average AVE. The stresses at the peripheral portions P1 and P2 when the notch width 13 is 0.9 mm are smaller than those when the notch width 13 is 0 mm.

When the notch width 13 is 1.4 mm, the notch width 13 corresponds to 93% of the thickness t12 with reference to the edge of the emitter buffer plate 40. A stress at the central portion when the notch width 13 is 1.4 mm is larger than that when the notch width 13 is 0.9 mm. The stress at the central portion is smaller than the pressure average AVE. Stresses at the peripheral portions P1 and P2 are 1.7 times the pressure average AVE. The stresses at the peripheral portions P1 and P2 when the notch width 13 is 1.4 mm are smaller than those when the notch width 13 is 0.9 mm.

When the notch width 13 is 1.9 mm, the notch width 13 corresponds to 127% of the thickness t12 with reference to the edge of the emitter buffer plate 40. A stress at the central portion when the notch width 13 is 1.9 mm is larger than that when the notch width 13 is 1.4 mm. The stress at the central portion is larger than the pressure average AVE. Stresses at the peripheral portions P1 and P2 are smaller than the pressure average AVE. The maximum value of the stress is 1.4 times the pressure average AVE. A pressure for compression-bonding the peripheral portion of the emitter buffer plate 40 to the semiconductor chip 10 is smaller than a pressure for compression-bonding the center of the emitter buffer plate 40 to the semiconductor chip 10.

When the notch width 13 is increased, the peak of the compression-bonding force decreases, and a surface pressure at the central portion increases. When the notch width 13 is set at about 1.4 mm and about 1.9 mm, the surface pressure at the central portion has a distribution which is almost uniform. Since the pressure for compression-bonding the emitter buffer plate 40 increases, the degree of contact among the column 22, the emitter buffer plate 40, and the semiconductor chip 10 increase, and the thermal resistance decreases.

Figure 31:
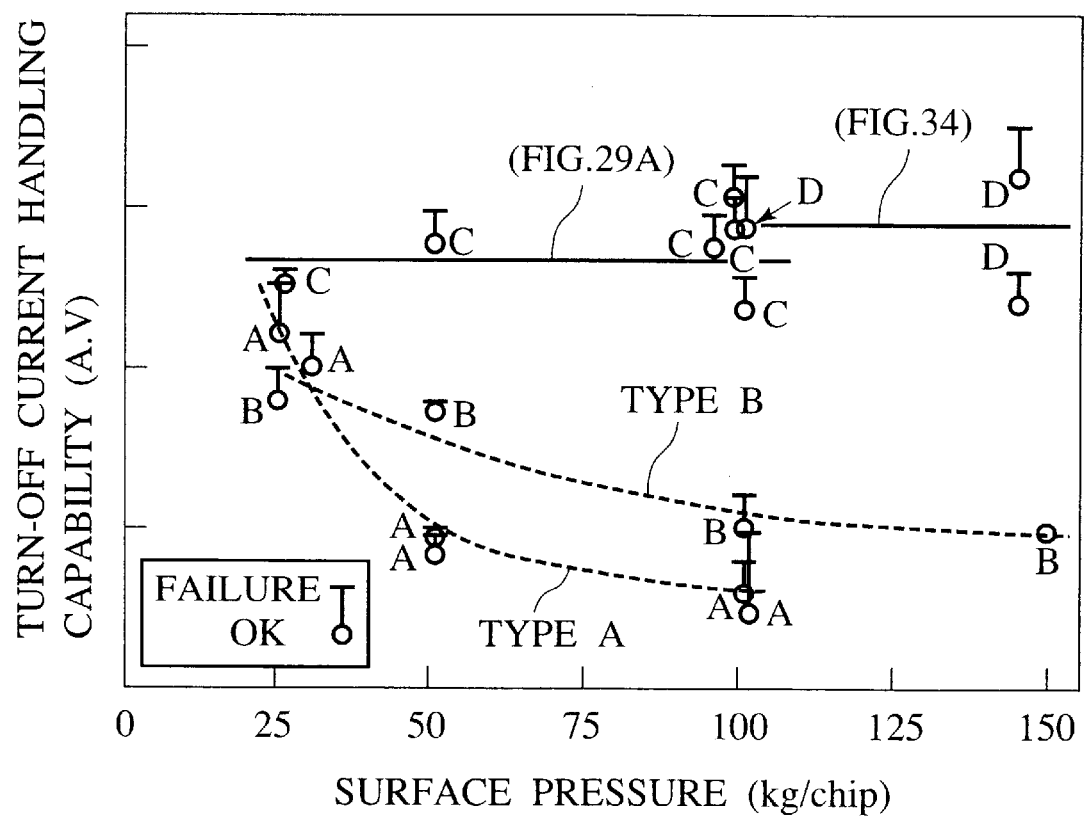
FIG. 31 is a graph show a relationship between the turn-off current handling capability and a surface pressure on the semiconductor chip of the power control semiconductor device of Embodiment 4.

As shown in FIG. 31, when the notch width is 0.9 mm in the power control semiconductor device of Embodiment 4, the turn-off current handling capability does not decrease with an increase in compression-bonding force. The large turn-off current handling capability could be obtained in a wide compression-bonding force range of 25 kg to 100 kg per chip. The nonuniformity of the surface pressure put on the semiconductor chip 10 was reduced, and the concentration of the main current Ic on a local portion of the semiconductor chip 10 was eliminated. The semiconductor chip 10 was not damaged, and the turn-off current capability could be prevented from decreasing.

Modification 1 of Embodiment 4

Figure 32:
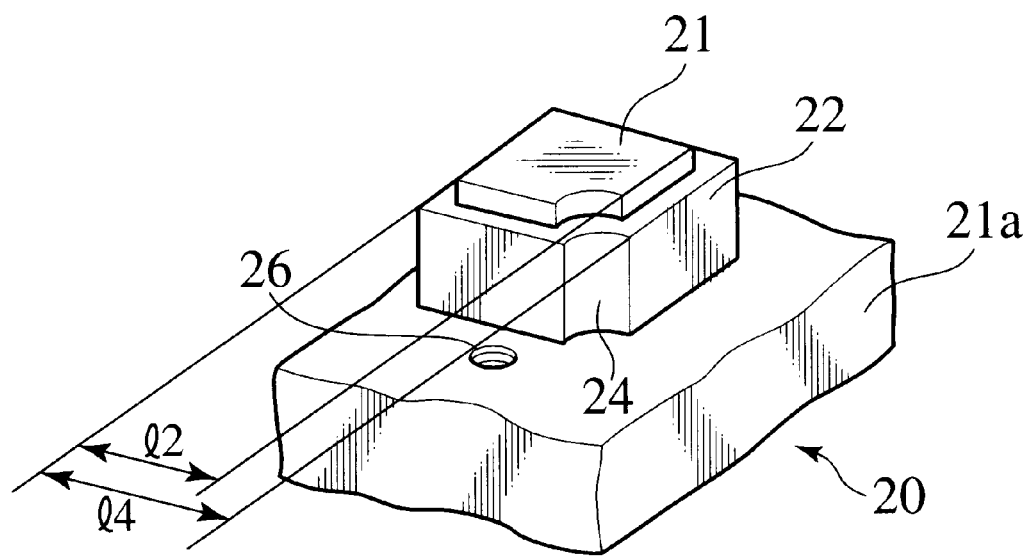
FIG. 32 is a perspective view of an emitter copper post of a power control semiconductor device according to Modification 1 of Embodiment 4.

A power control semiconductor device according to Modification 1 of Embodiment 4 is different from the power control semiconductor device of Embodiment 4 shown in FIG. 29B in the shapes of the columns 22 of the emitter copper posts 20 as shown in FIG. 32. The shapes of the upper surfaces 21 in both the power control semiconductor devices are equal to each other. In order to decrease the area of the upper surface 21, notching is used in place of the chamfering. The edge of the upper surface 21 is circularly notched to reduce the area of the upper surface 21.

Modification 2 of Embodiment 4

Figure 33:
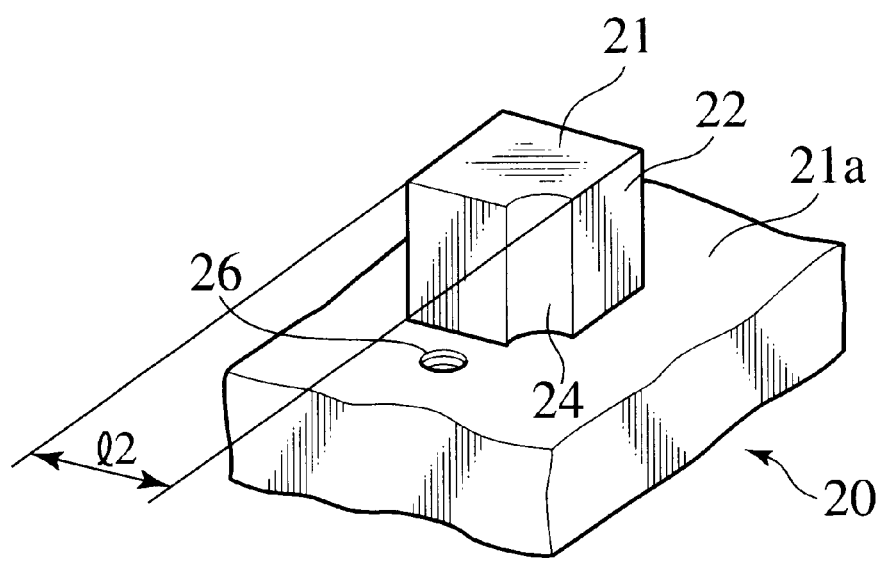
FIG. 33 is a perspective view of an emitter copper post of a power control semiconductor device according to Modification 2 of Embodiment 4.

A power control semiconductor device according to Modification 2 of Embodiment 4 is different from the power control semiconductor device of Embodiment 4 shown in FIG. 29B in the shapes of the columns 22 of the emitter copper posts 20 as shown in FIG. 33. The shapes of the upper surfaces 21 in both the power control semiconductor devices are equal to each other. In order to decrease the area of the upper surface 21, the width 14 of the column 22 is decreased to the width 12 of the upper surface 21 without the chamfering. The column 22 is decreased in width to prevent the upper surface 21 from being in contact with the thick portion of the peripheral portion of the emitter buffer plate 40.

Modification 3 of Embodiment 4

Figure 34:
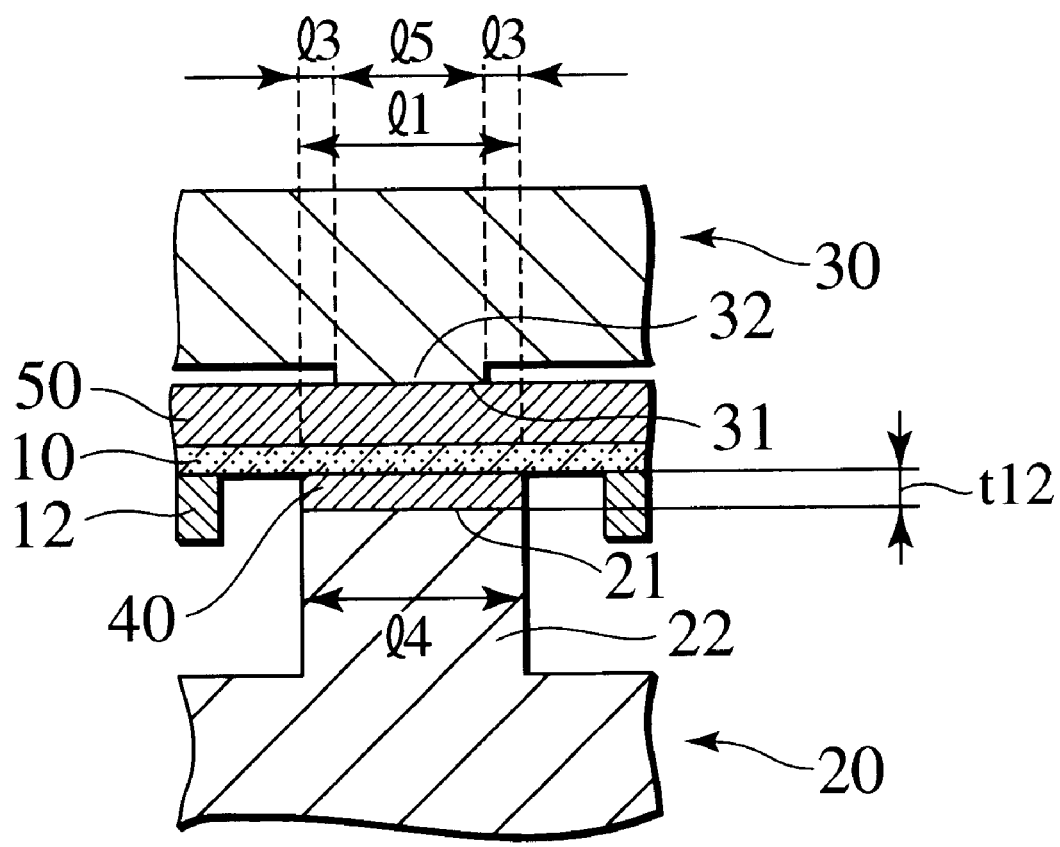
FIG. 34 is a perspective view of a power control semiconductor device according to Modification 3 of Embodiment 4.

A power control semiconductor device according to Modification 3 of Embodiment 4 is different from the power control semiconductor device of Comparative Example 1 shown in FIG. 22A in the shapes of the collector copper posts 30 as shown in FIG. 34. The collector copper post 30 has a projecting portion 32. The shape of an upper surface 31 of the projecting portion 32 is equal to the shape of the upper surface 21 in Embodiment 4 shown in FIG. 29A.

The width 15 of the contact region between the projecting portion 32 of the collector copper post 30 opposing the column 22 and the collector buffer plate 50 is smaller than the width 14 of the contact region between the emitter buffer plate 40 and the semiconductor chip 10. Since a surface pressure applied on the semiconductor chip by compression bonding becomes almost uniform to prevent current concentration, the turn-off current capability increases, and the semiconductor chip is prevented from being damaged.

The upper surface 31 of the projecting portion 32 of the collector copper post 30 opposing the column 22 has a shape which is equal to the shape of a region of the emitter buffer plate 40 except for the thick portion of the peripheral portion of the emitter buffer plate 40. The area of the upper surface 31 is smaller than the contact area between the collector buffer plate 50 and the semiconductor chip 10. The collector copper post 30 and the collector buffer plate 50 are separated from each other above a region spaced from the edge of the emitter buffer plate 40 by a distance 13 which is 86% of the thickness 12 of the emitter buffer plate 40.

The present inventors used simulation to calculate a surface pressure distribution obtained by the notch width 13.

The shape and compression-bonding force of the emitter buffer plate 40 used in the simulation were the same as those in Embodiment 4. The notch width 13 was set to 0 mm, 0.9 mm, 1.4 mm, and 1.9 mm. The same results as shown in FIG. 30 were obtained.

When the notch width 13 is 0.9 mm or more, the notch width 13 corresponds to 60% or more of the thickness t12 with reference to the edge of the emitter buffer plate 40. A stress at the central portion when the notch width 13 is 0.9 mm or more is larger than that when the notch width 13 is 0 mm. Stresses at the peripheral portions P1 and P2 when the notch width 13 is 0.9 mm or more is smaller than those when the notch width 13 is 0 mm.

As described in Modification 3 in FIG. 31, when the notch width is 1.4 mm in the power control semiconductor device of Modification 3 of Embodiment 4, the turn-off current handling capability does not decrease with an increase in compression-bonding force. The large turn-off current handling capability could be obtained in a wide compression-bonding force range of 100 kg to 150 kg per chip. The nonuniformity of the surface pressure applied on the semiconductor chip 10 was reduced, and the concentration of the main current Ic on a local portion of the semiconductor chip 10 was eliminated. The semiconductor chip 10 was not damaged, and the turn-off current capability could be prevented from decreasing.

The semiconductor chip 10 is not limited to an IGBT. The present invention can also be applied to an MCT, an IEGT, a MOSFET, and the like.

The present invention may be embodied in other specific forms without departing from the spirit or essential characteristics thereof. The embodiments are therefore to be considered in all respects as illustrative and not restrictive, the scope of the present invention being indicated by the appended claims rather than by the foregoing description, and all the changes which come within the meaning and range of equivalency of the claims are therefore intended to be embraced therein.

What is claimed is:

1. A semiconductor device comprising:

a first conductor having a plane surface;

semiconductor chips each having a first surface arranged adjacent the plane surface, and having a first main electrode arranged on the first surface and electrically connected to the first conductor, a second main electrode arranged on a back surface of the first surface, and a control electrode arranged on the back surface of the first surface and configured to switch a current flowing between the first main electrode and the second main electrode;

a second conductor electrically connected to the second main electrode and having columns each having an upper surface arranged below each of the semiconductor chips and equal to the number of the semiconductor chips; and a circuit board having openings penetrated by the columns, the number of the openings being equal to the number of the semiconductor chips and having a first insulating film, a first conductive film arranged on a peripheral portion of the first insulating film on a second surface of the first insulating film and electrically connected to one of the control electrode and the second conductor, and a second conductive film arranged on a back surface of the second surface of the first insulating film and the peripheral portion above the first conductive film and electrically connected to the other of the control electrode and the second conductor.

2. The semiconductor device as claimed in claim 1, further comprising:

a first conductive plate arranged between and on the plane surface and the first surface and electrically connected to the first conductor and the first main electrode.

3. The semiconductor device as claimed in claim 1, further comprising:

a second conductive plate arranged between and on the back surface of the first surface and the upper surface and electrically connected to the second main electrode and the second conductor.

4. The semiconductor device as claimed in claim 1, further comprising:

third conductors electrically connected to the control electrode and the second conductive film and equal to the number of the semiconductor chips.

5. The semiconductor device as claimed in claim 1, further comprising:

a fourth conductor arranged near the third conductor and electrically connected to the second conductor and the first conductive film.

6. The semiconductor device as claimed in claim 1, wherein the circuit board further comprises a resistor arranged above the first insulating film and electrically connected between the second conductor and the first conductive film.

7. The semiconductor device as claimed in claim 1, wherein the circuit board further comprises a resistor arranged above the first insulating film and electrically connected between the control electrode and the second conductive film.

8. The semiconductor device as claimed in claim 1, wherein the circuit board further comprises an insulating substrate having a third surface arranged on the first conductive film.

9. The semiconductor device as claimed in claim 8, wherein the circuit board further comprises a third conductive film arranged under the peripheral portion on a back surface of the third surface of the insulating substrate and electrically connected to the second conductive film, a second insulating film arranged on the third conductive film, and an fourth conductive film arranged under the peripheral portion and the third conductive film on the second insulating film and electrically connected to the first conductive film.

10. The semiconductor device as claimed in claim 9, wherein the circuit board further comprises a first through hole formed in the peripheral portion and penetrating the circuit board, a fifth conductive film arranged on a side wall of the first through hole and electrically connected to the second conductive film and the third conductive film, a second through hole formed in the peripheral portion adjacent the first through hole and penetrating the circuit board, and a sixth conductive film arranged on a side wall of the second through hole and electrically connected to the first conductive film and the fourth conductive film.

11. The semiconductor device as claimed in claim 4, wherein the third conductor has a first sheath vertically electrically connected to one of the control electrode and the second conductive film, a first elastic member arranged in the first sheath, a first sphere arranged in the first sheath on the first elastic member configured to compress the first elastic member, and a first pin arranged in the first sheath and electrically connected to the first sheath vertically electrically connected to the other of the control electrode and the second conductive film.

12. The semiconductor device as claimed in claim 5, wherein the fourth conductor comprises a conductive ring arranged on the second conductor and electrically connected to the second conductor, a seventh conductive film arranged on a side wall of a third through hole formed on the conductive ring and penetrating the circuit board and electrically connected to the conductive ring, and an eighth conductive film arranged on a side wall of a fourth through hole formed adjacent the third through hole and penetrating the circuit board and electrically connected to the seventh conductive film and the first conductive film.

13. The semiconductor device as claimed in claim 12, wherein the second conductor has a screw hole formed under the conductive ring, and a screw penetrating the conductive ring and the third through hole and fixed in the screw hole.

14. The semiconductor device as claimed in claim 5, wherein the fourth conductor has a second sheath electrically connected to one of the second conductor and the first conductive film, a second elastic member provided in the second sheath, a second sphere provided in the second sheath on the second elastic member configured to compress the second elastic member, and a second pin provided in the second sheath electrically connected to the second sheath and electrically connected to the other of the second conductor and the first conductive film.

15. The semiconductor device as claimed in claim 4, further comprising:

a fourth conductor subtending the third conductor through the circuit board and electrically connected to the second conductor and the first conductive film.

16. The semiconductor device as claimed in claim 1, wherein a distance between the circuit board and a lower surface of the column is longer than a distance between the circuit board and the upper surface of the column.

17. A semiconductor device comprising:

a first conductor having a plane surface;

a first conductive plate arranged on the plane surface and electrically connected to the first conductor;

semiconductor chips each having a first surface arranged on the first conductive plate, and having a first main electrode arranged on the first surface and electrically connected to the first conductor, a second main electrode arranged on a back surface of the first surface, and a control electrode arranged on the back surface of the first surface and configured to switch a current flowing between the first main electrode and the second main electrode;

second conductive plates equal to the number of the semiconductor chips arranged on the back surface of the first surface electrically connected to the second main electrode, a pressure applied by a peripheral portion to one of the semiconductor chips configured to be a maximum of twice a mean pressure applied by one of the second conductive plates to the one of the semiconductor chips; and a second conductor electrically connected to the second main electrode and having columns equal to the number of the semiconductor chips and having upper surfaces arranged on the second conductive plate.

18. The semiconductor device as claimed in claim 17, wherein the pressure applied by the peripheral portion to the one of the semiconductor chips is smaller than a pressure applied to the one of the semiconductor chips by a central portion of the second conductive plate inside the peripheral portion.

19. The semiconductor device as claimed in claim 17, wherein the second conductive plate has a thickness not less than 0.3 mm and not more than 2.0 mm, and has a region spaced from the second conductor having a distance between the region and an edge of the second conductive plate configured to be not more than 60% of the thickness of the second conductive plate.

20. The semiconductor device as claimed in claim 19, wherein the second conductive plate includes the region spaced from the second conductor having a distance between the region and the edge configured to be not more than 86% of the thickness of the second conductive plate.

21. The semiconductor device as claimed in claim 17, wherein the second conductive plate has a thickness not less than 0.3 mm and not more than 2.0 mm and has a region having a distance between the region and an edge of the second conductive plate configured to be not more than 60% of the thickness of the second conductive plate, and the first conductor is spaced from the first conductive plate above the region.

22. The semiconductor device as claimed in claim 21, wherein the fourth conductive plate includes the region having a distance between the region and the edge configured to be not more than 86% of the thickness of the second conductive plate, and the first conductor is spaced from the first conductive plate above the region.

\* \* \* \* \*